(12) United States Patent
Bach

(10) Patent No.: US 7,763,987 B2
(45) Date of Patent: Jul. 27, 2010

(54) INTEGRATED CIRCUIT AND METHODS OF MANUFACTURING A CONTACT ARRANGEMENT AND AN INTERCONNECTION ARRANGEMENT

(75) Inventor: Lars Bach, Ullersdorf (DE)

(73) Assignee: Qimonda AG, Munich (DE)

( * ) Notice: Subject to any disclaimer, the term of this patent is extended or adjusted under 35 U.S.C. 154(b) by 616 days.

(21) Appl. No.: 11/679,295

(22) Filed: Feb. 27, 2007

(65) Prior Publication Data

US 2008/0203586 A1    Aug. 28, 2008

(51) Int. Cl.
*H01L 21/4763* (2006.01)
(52) U.S. Cl. .................. 257/786; 257/758; 257/E23.01; 257/E21.495; 438/624
(58) Field of Classification Search .................. 257/786, 257/758, E23.01, E21.495; 438/624
See application file for complete search history.

(56) References Cited

U.S. PATENT DOCUMENTS

| 5,960,320 A | * | 9/1999 | Park .......................... 438/688 |
| 2004/0053501 A1 | | 3/2004 | Brennan et al. |
| 2005/0167839 A1 | | 8/2005 | Wetzel et al. |
| 2005/0196685 A1 | | 9/2005 | Wang et al. |
| 2005/0202683 A1 | | 9/2005 | Wang et al. |
| 2006/0077702 A1 | | 4/2006 | Sugimae et al. |

OTHER PUBLICATIONS

Wolf, S. "Silicon Processing for the VLSI Era", vol. 4, Lattice Press, 2002, p. 679, date: 2002.
U.S. Appl. No. 11/583,145, date: Apr. 24, 2008.

* cited by examiner

*Primary Examiner*—Thinh T Nguyen
(74) *Attorney, Agent, or Firm*—Edell, Shapiro & Finnan, LLC

(57) ABSTRACT

A contact arrangement is manufactured by providing a substrate that includes first regions that are arranged along a row direction and a second region. An interlayer is provided that covers the first regions and the second region. A buried mask including a first trim opening above the first regions is provided. A top mask including first template openings is provided, where each first template opening is arranged above one of the first regions. A second template opening is provided above the second region. The fill material and the interlayer are etched to form contact trenches above the first regions and the second region. Substrate area efficient chains of evenly spaced contacts are provided.

9 Claims, 33 Drawing Sheets

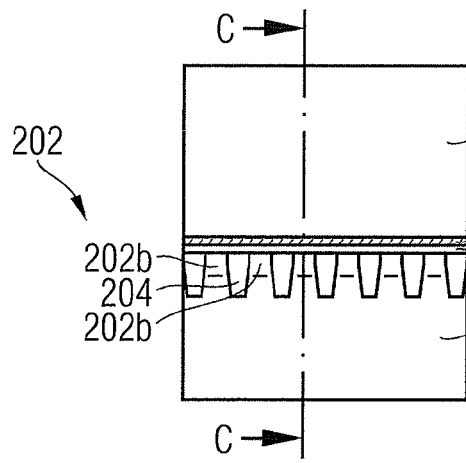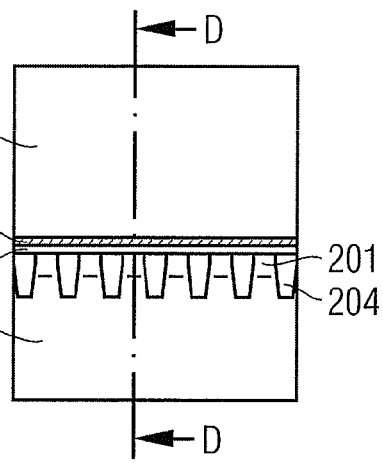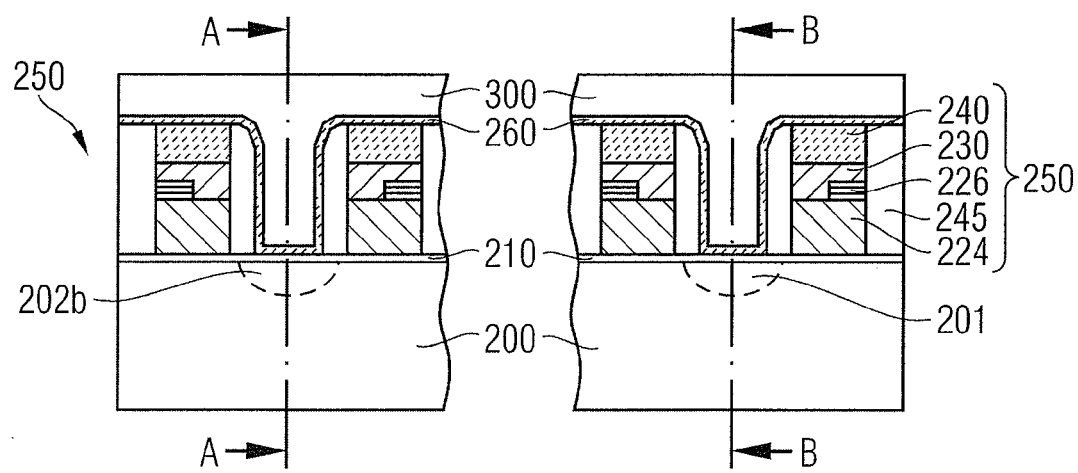

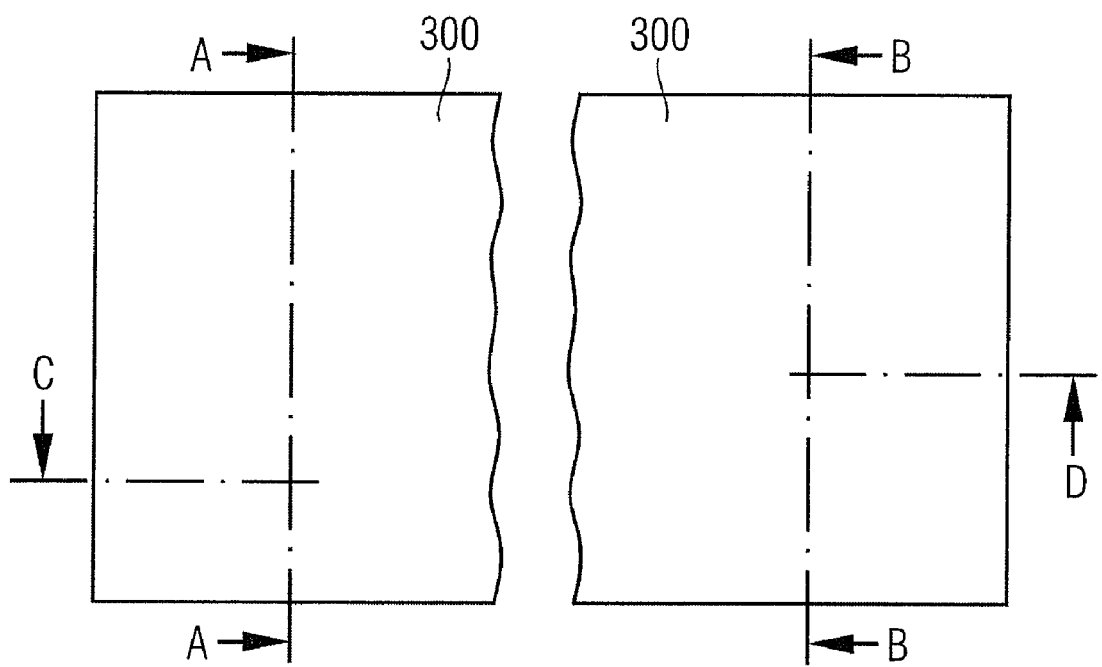

FIG 3A
FIG 3B
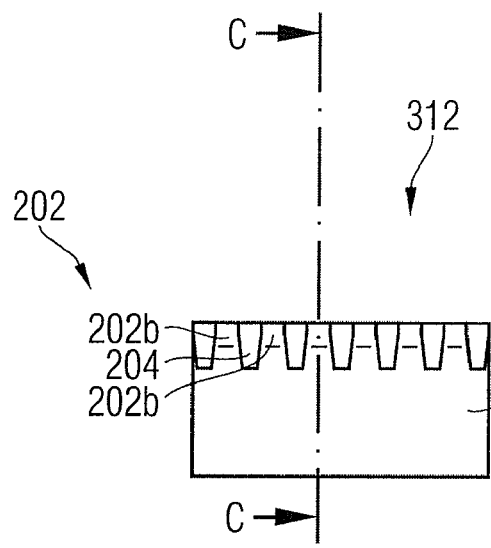
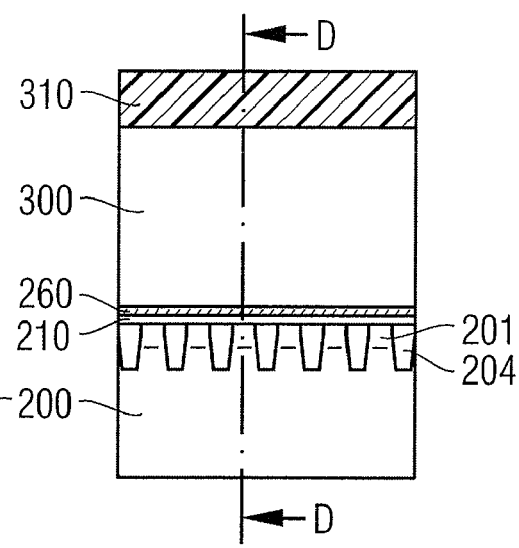
FIG 3C
FIG 3D
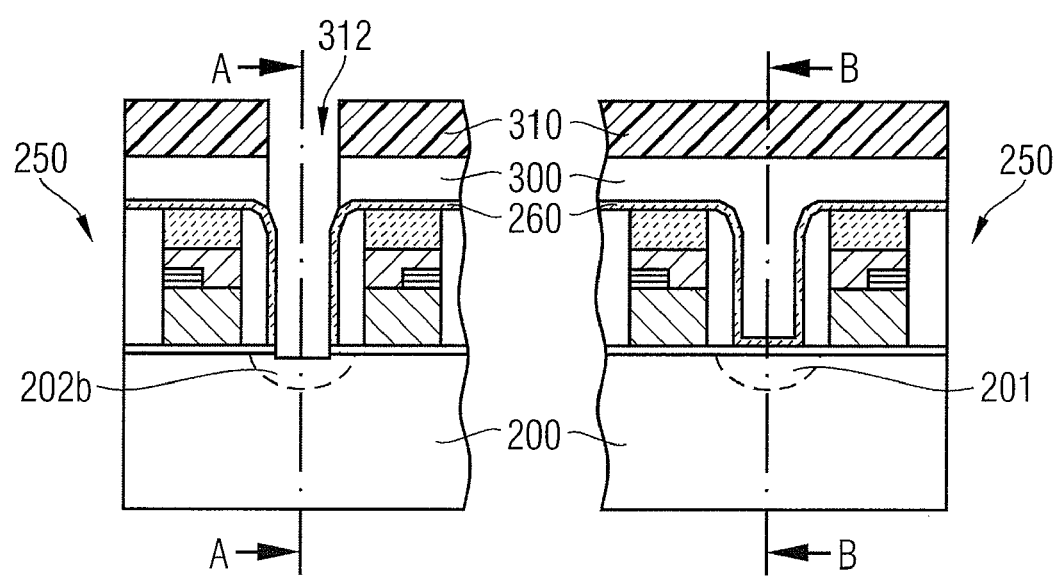

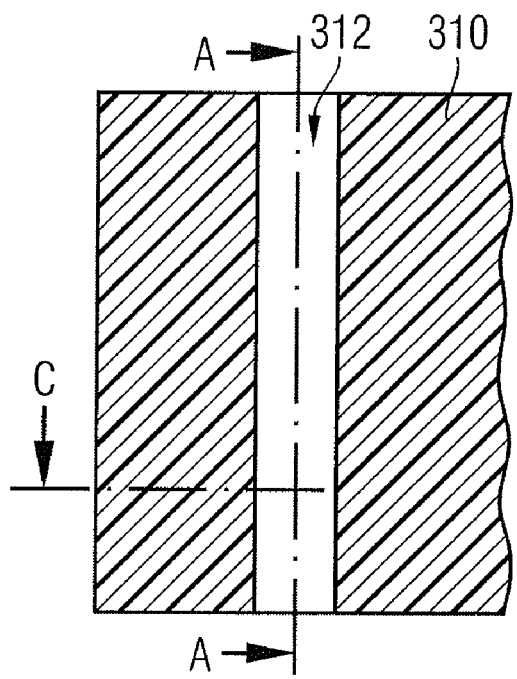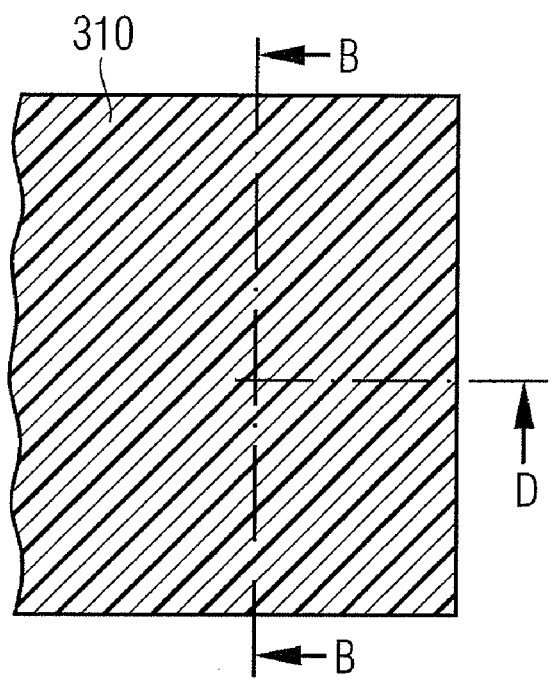

FIG 6E
FIG 6F
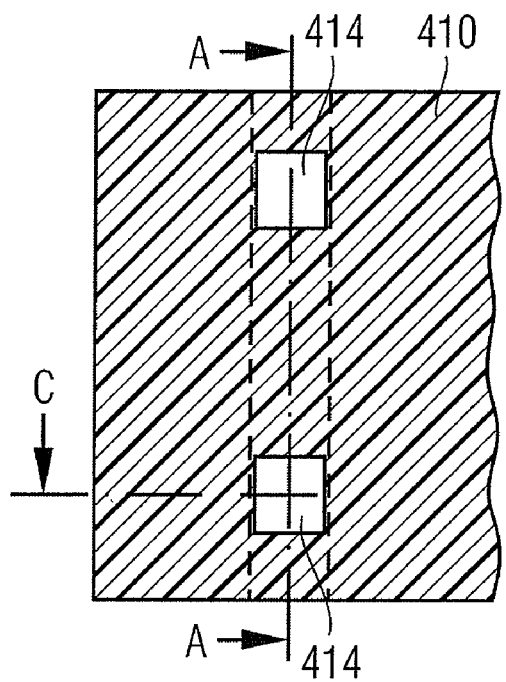
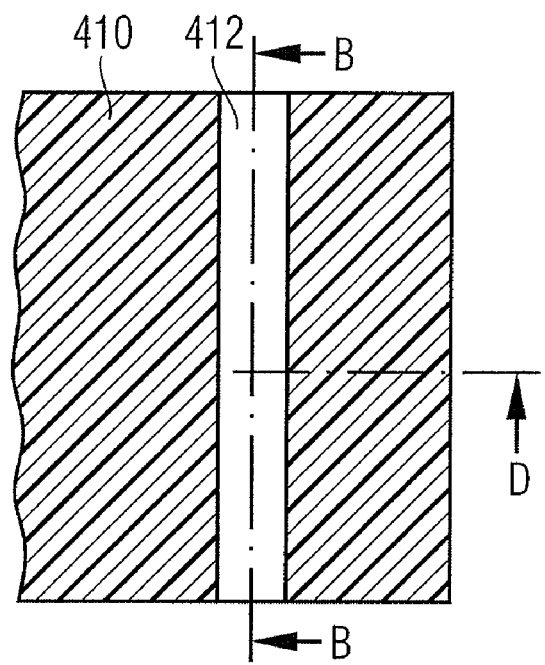

FIG 7E
FIG 7F
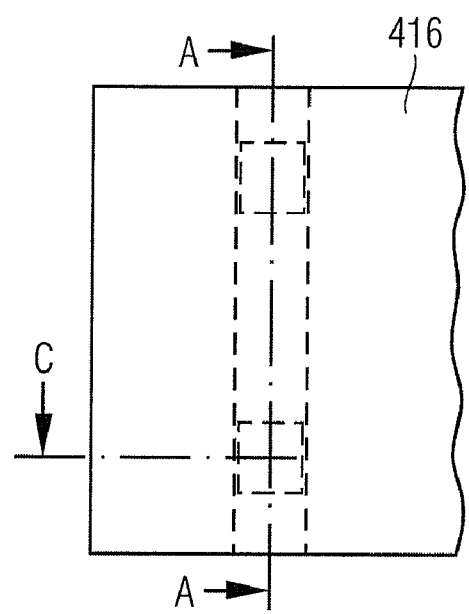
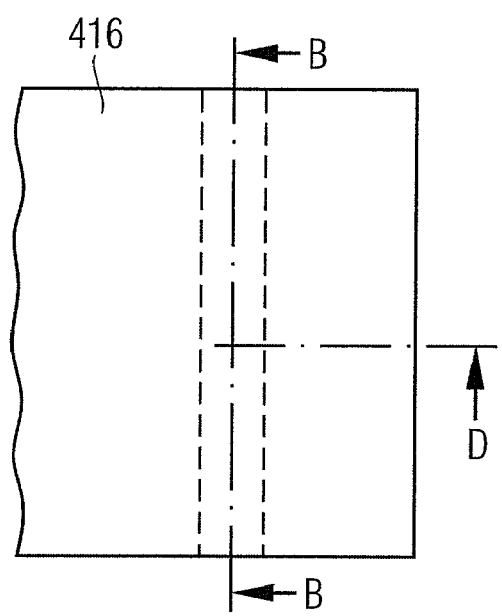

FIG 8A
FIG 8B
FIG 8C
FIG 8D
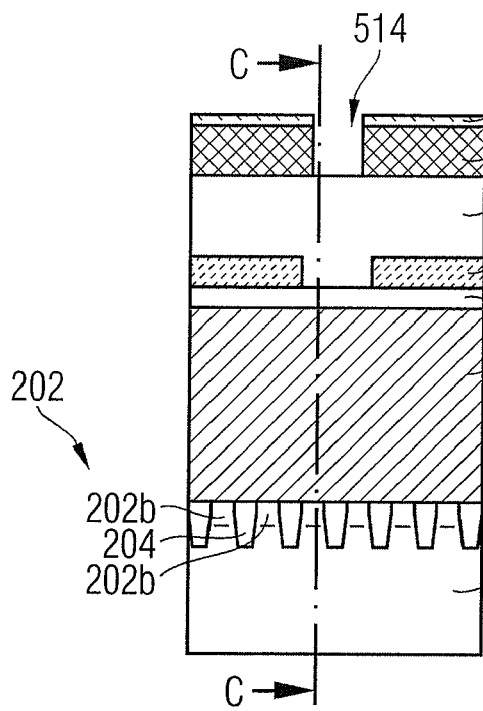
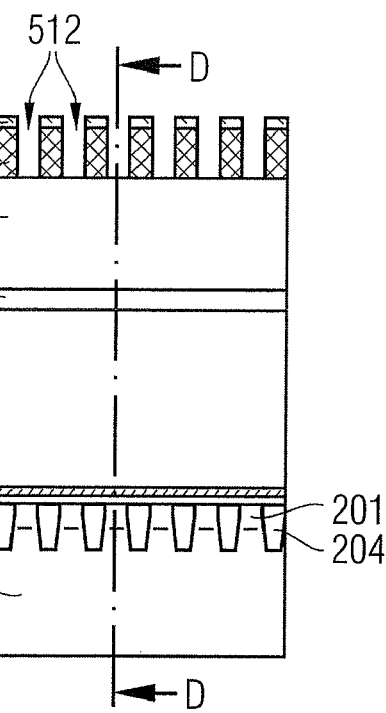
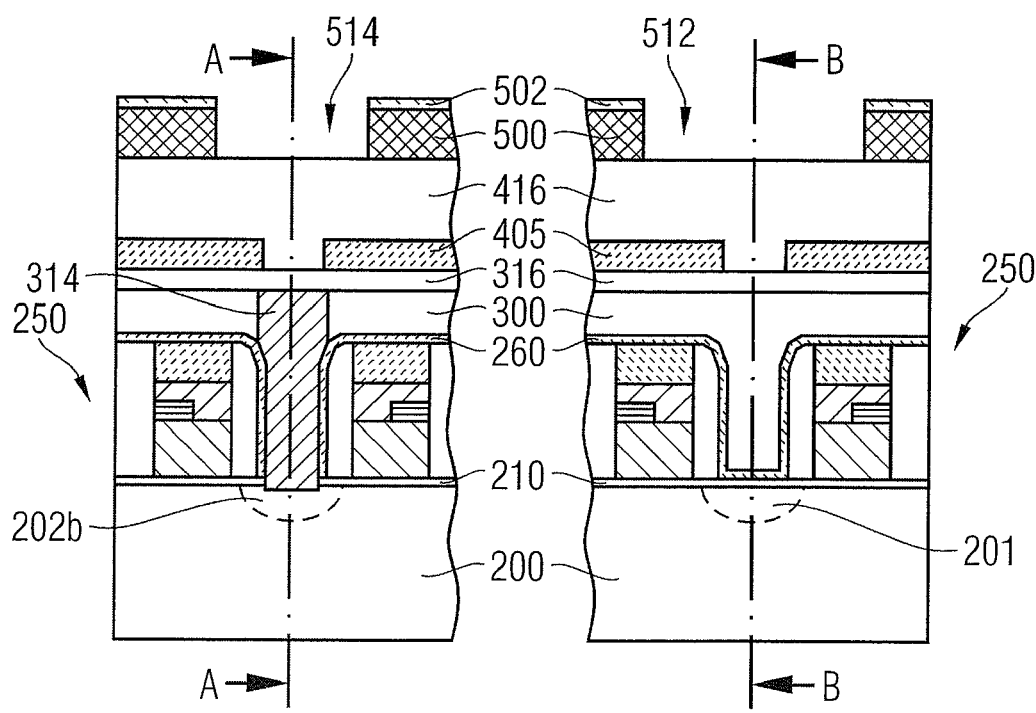

FIG 9A
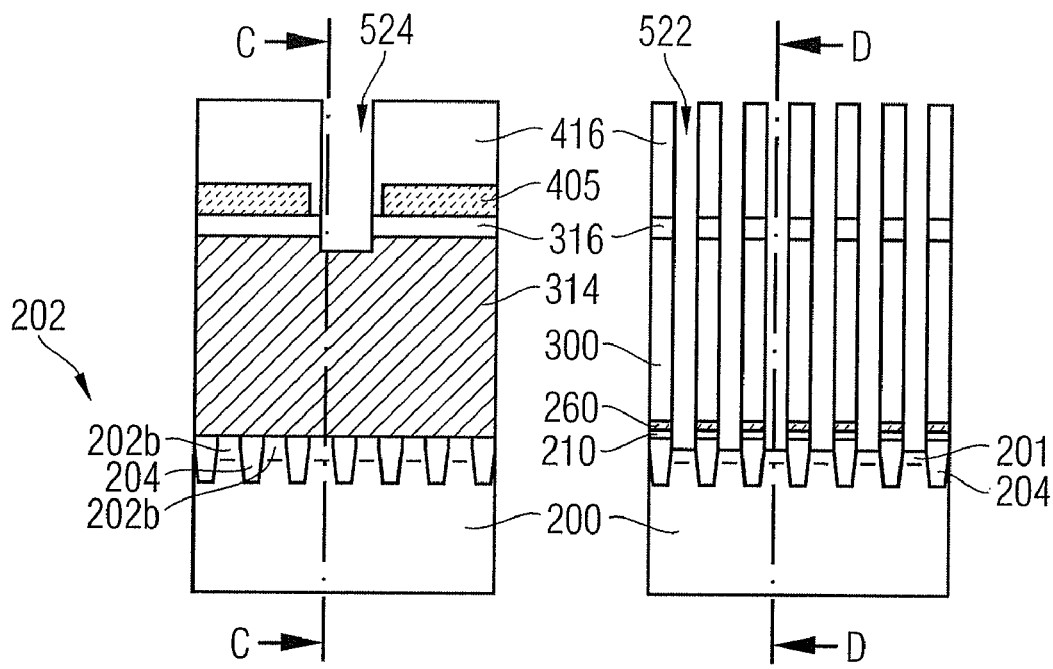
FIG 9B
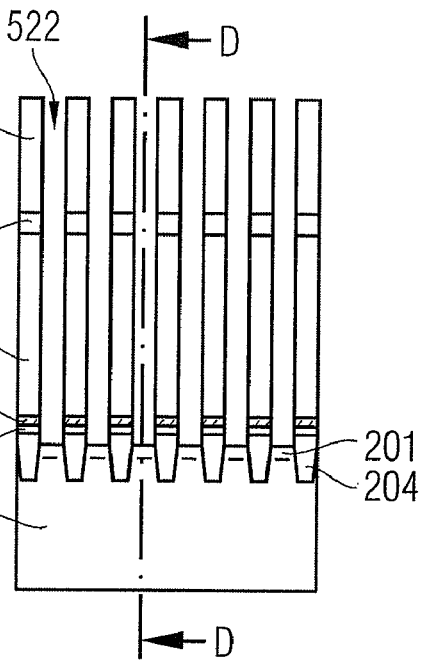
FIG 9C
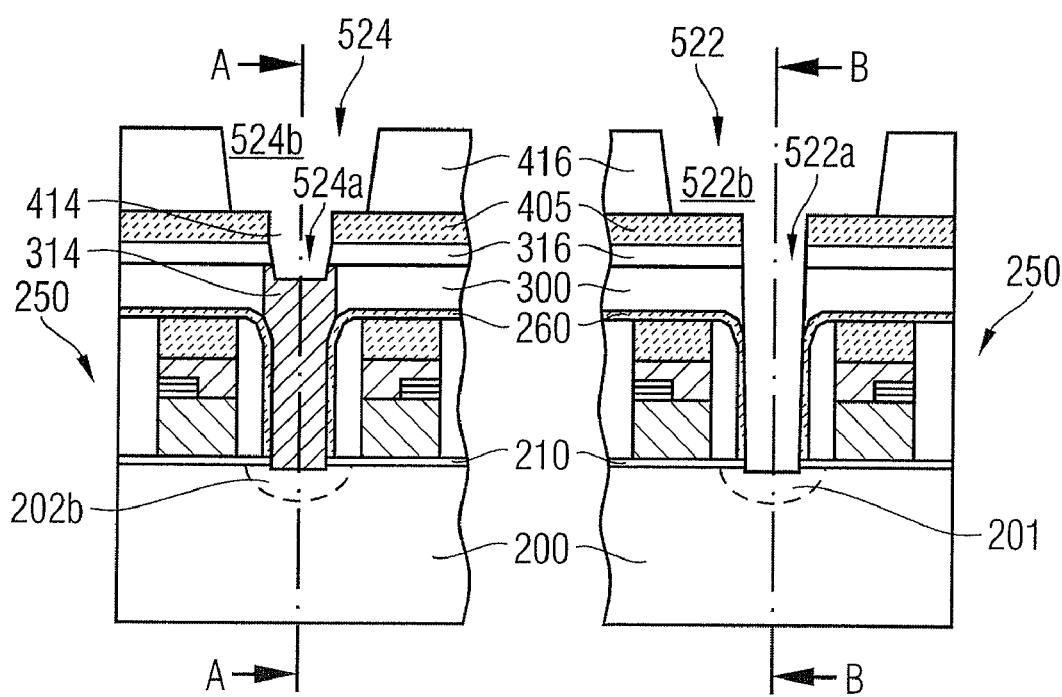
FIG 9D

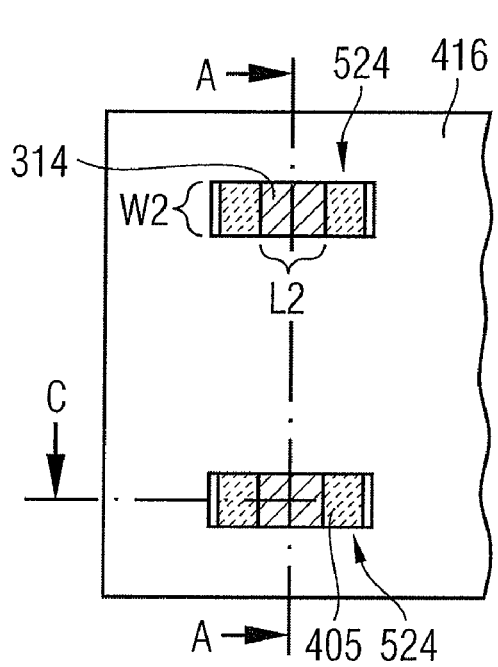
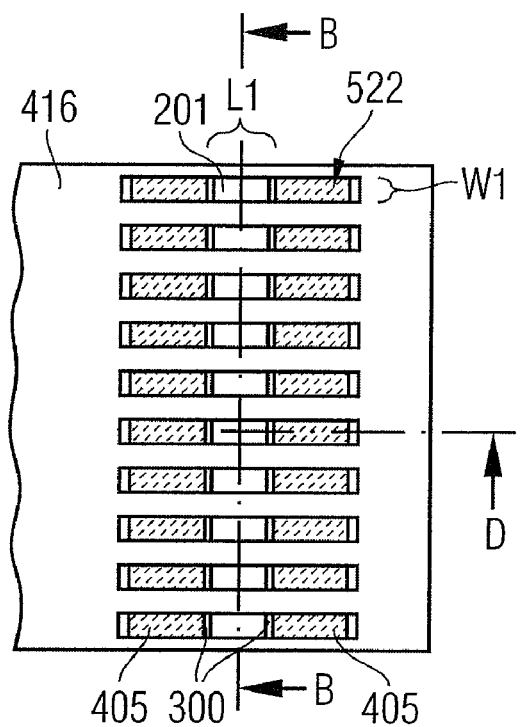
FIG 9E
FIG 9F

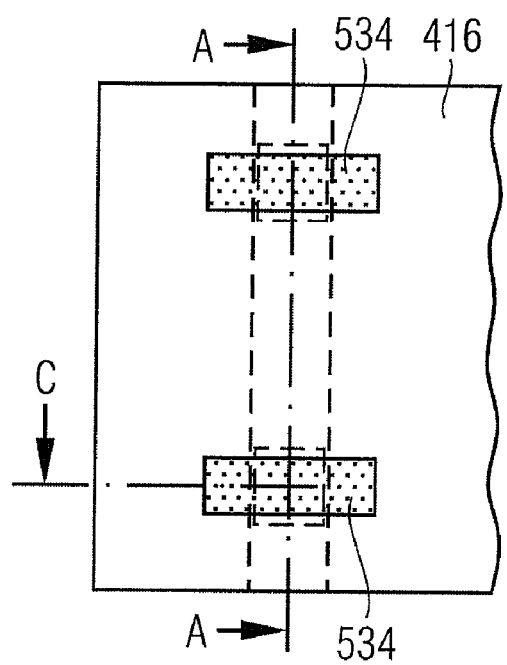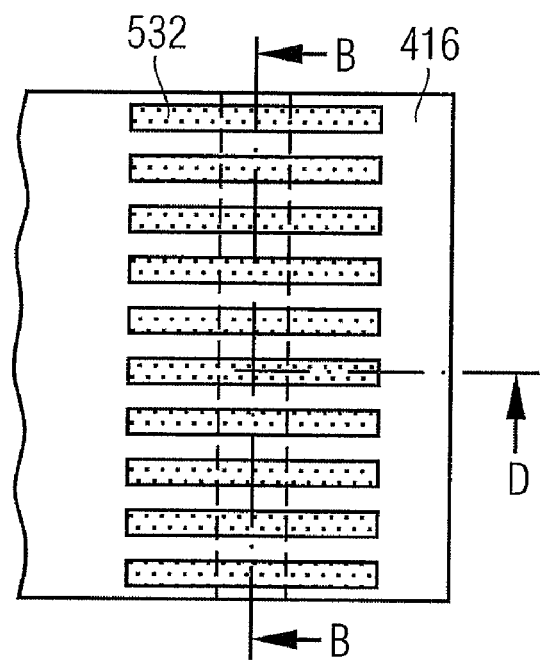

FIG 12E
FIG 12F
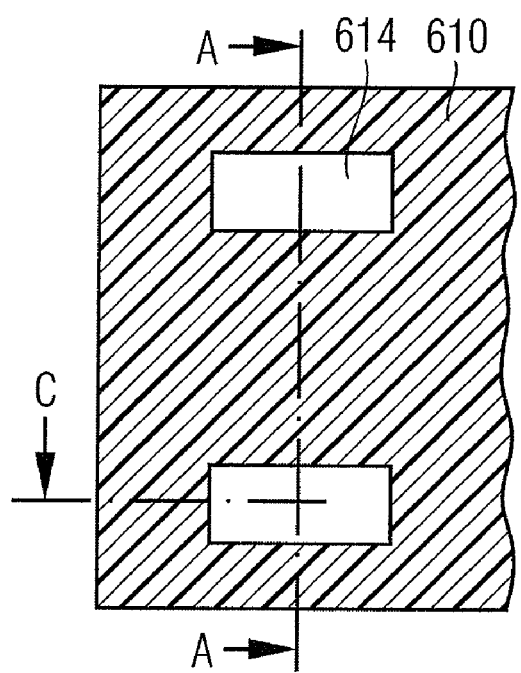
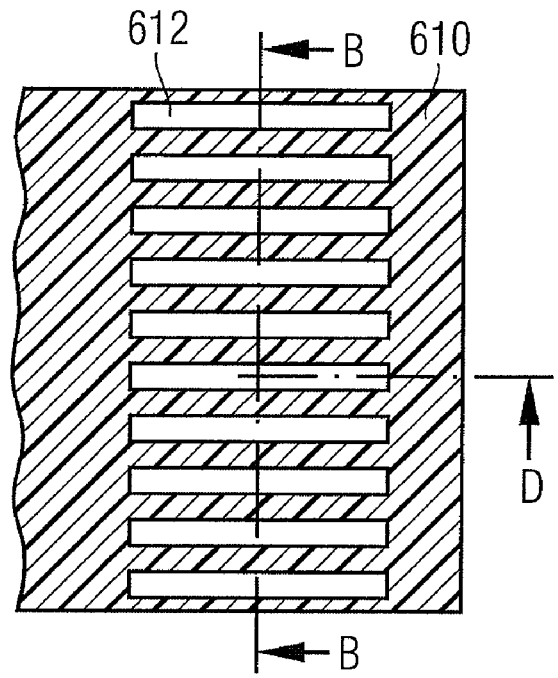

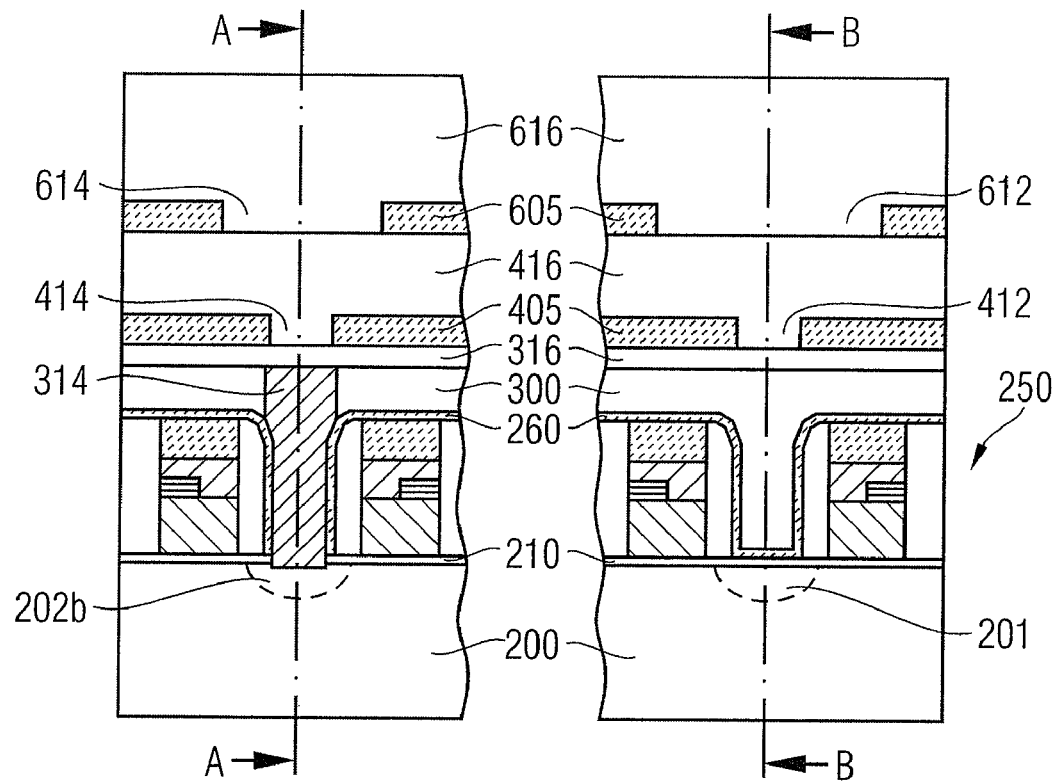
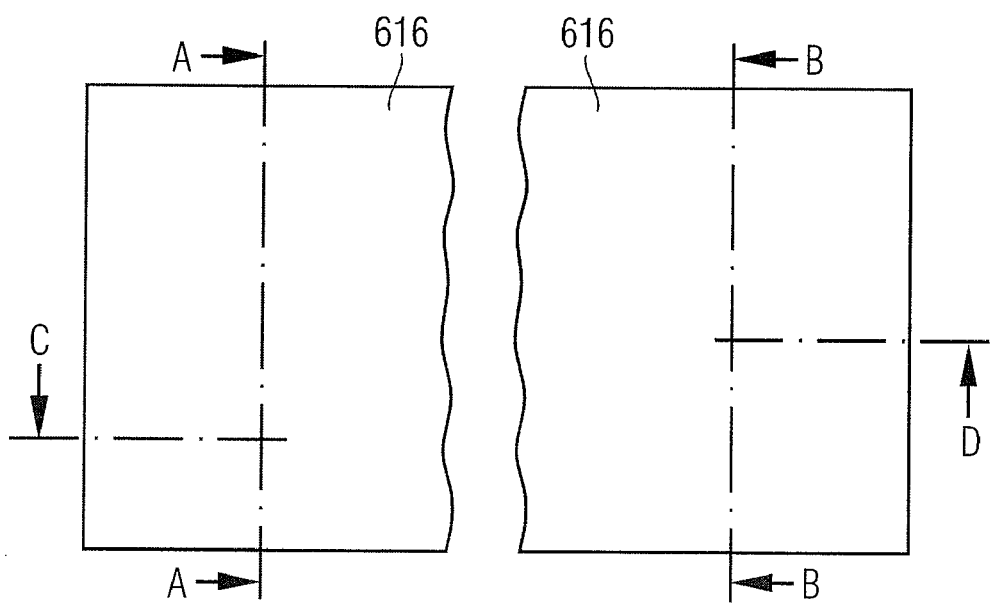

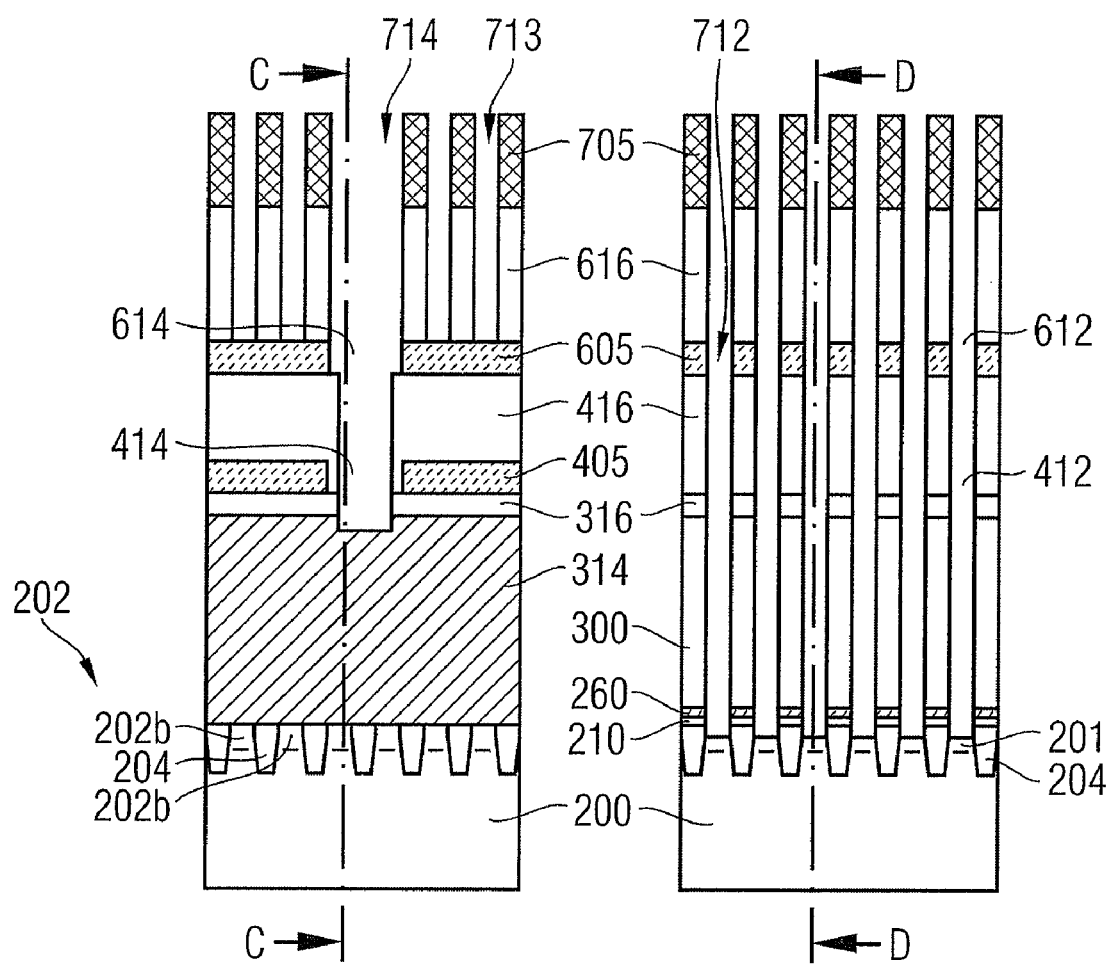

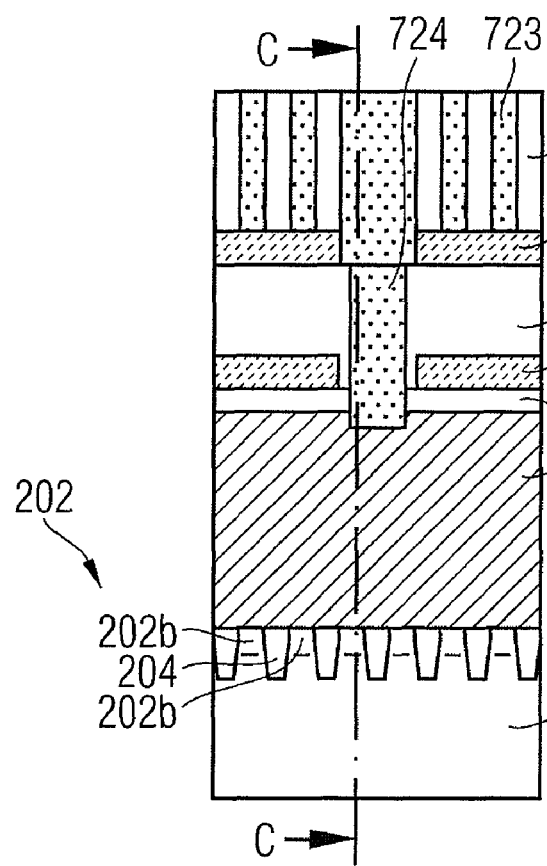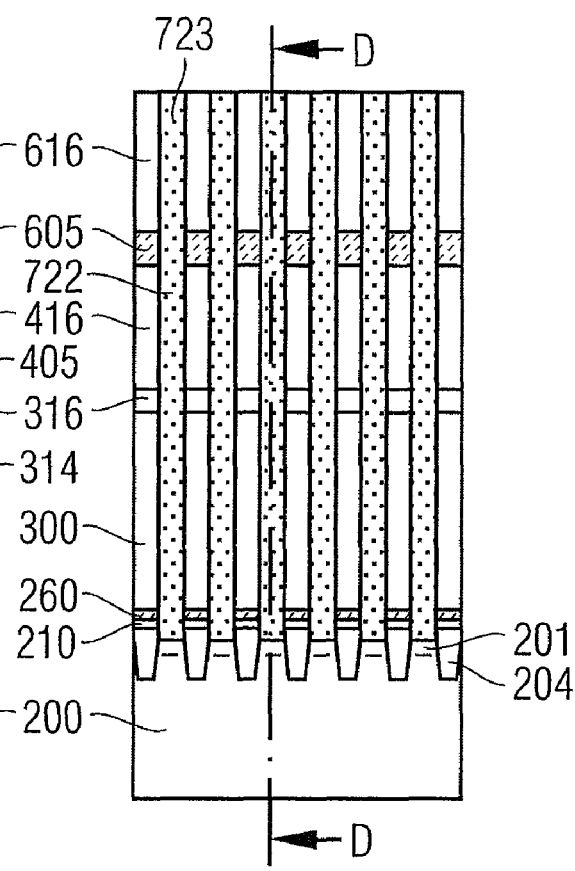
FIG 15A
FIG 15B

FIG 15C
FIG 15D
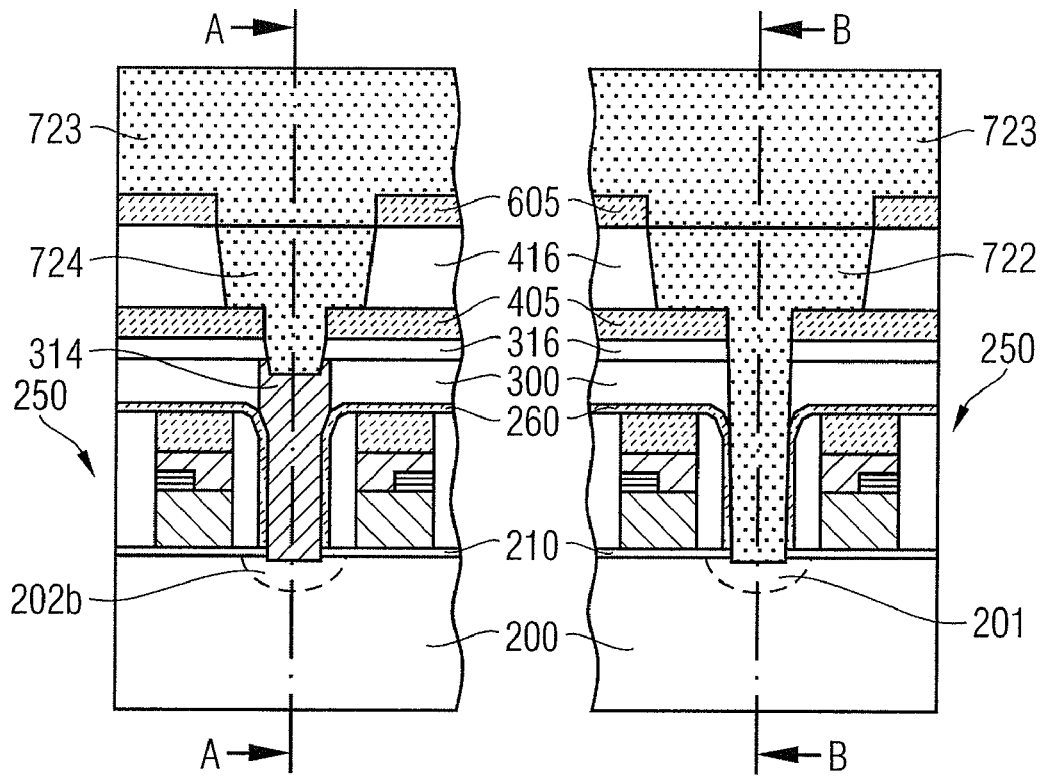
FIG 15E
FIG 15F
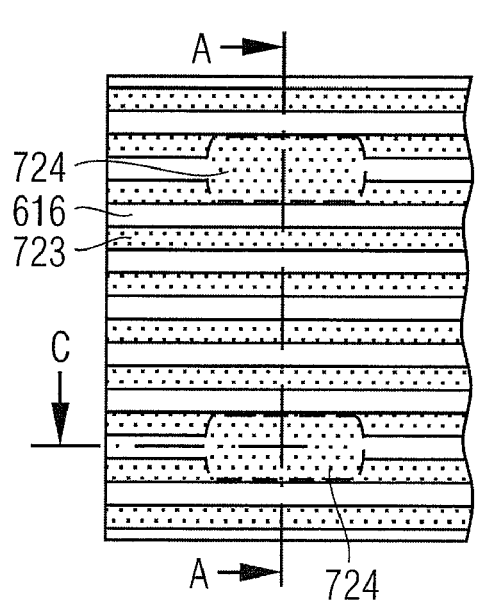
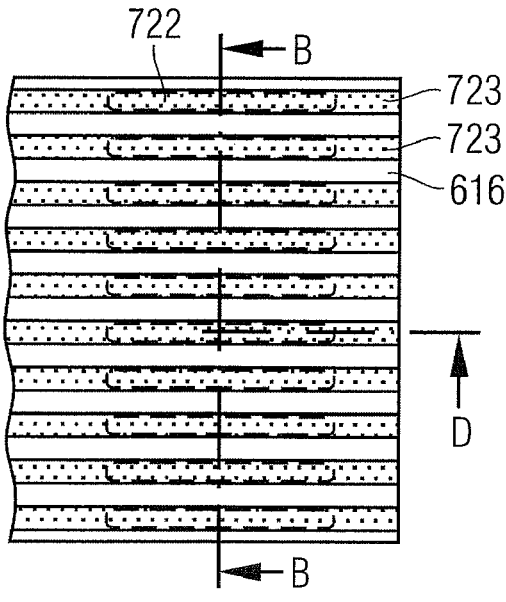

FIG 16A
FIG 16B
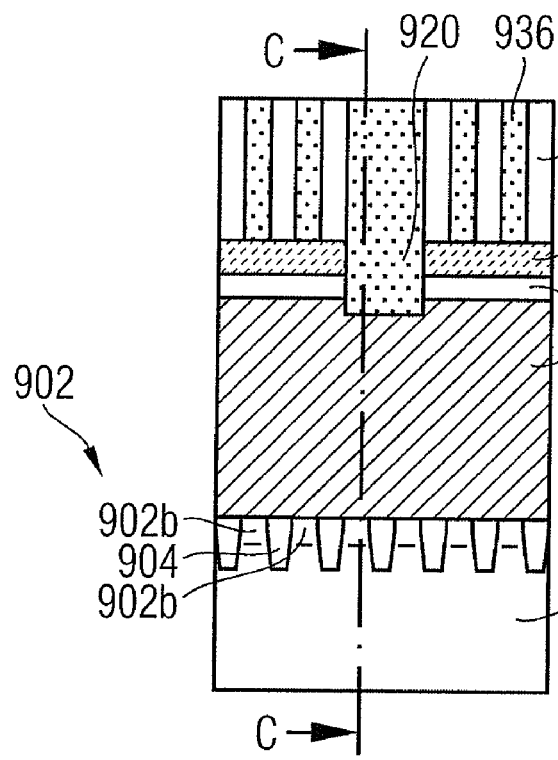
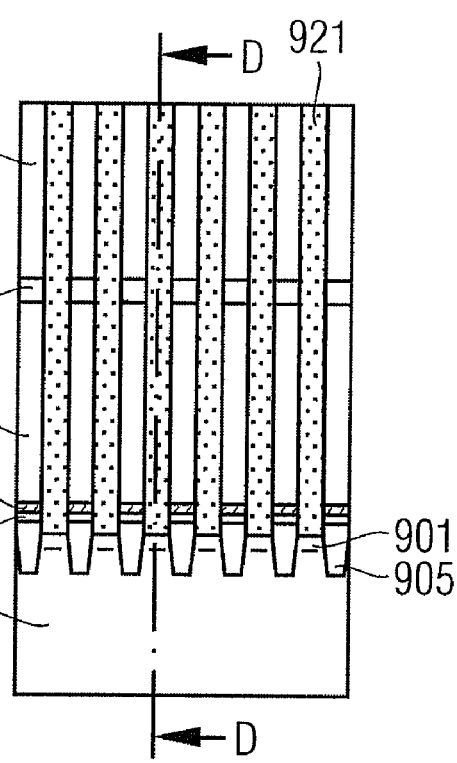

INTEGRATED CIRCUIT AND METHODS OF MANUFACTURING A CONTACT ARRANGEMENT AND AN INTERCONNECTION ARRANGEMENT

BACKGROUND

Dense sensor and memory cell arrays comprise dense fields of connection lines. The connection lines are, for example, data or supply lines that are connected to input/output terminals of the memory cells or word lines connecting the gate electrodes of access transistors of the memory cells. Resolution enhancement techniques (RETs) improve the resolution of optical lithographic systems such that evenly spaced parallel line structures may be formed at a pitch exceeding the nominal resolution limit of the lithographic system. The half pitch of the lines in the densest line field that can be achieved by RETs is referred to herein as minimum lithographic feature size "F".

The gate, supply and data lines of sensor or memory cell arrays are connected to further electrical circuits via connection lines that are provided in a connection plane above or below the line field. The arrays comprise contact structures connecting each single cell or a group of cells to a corresponding connection line in the connection plane. For these contact structures, the resolution enhancement techniques are not applicable to the same degree as for evenly spaced lines. For example, an isolated contact chain which comprises evenly spaced contacts being arranged along a chain axis at a 2F-pitch, but lacking corresponding neighboring structures perpendicular to the chain axis, requires contacts with a length of about 4F to 5F perpendicular to the chain axis and thus consumes more substrate area than a $F^2$-contact would consume.

A need exists for simple and stable methods of manufacturing contact and interconnection arrangements that provide area efficient contact and interconnection arrangements.

SUMMARY

A method of manufacturing a contact arrangement comprises providing an interlayer covering first regions of a substrate, where the first regions are arranged along a row direction, providing a buried mask including a first trim opening above the first regions and a second trim opening above a second region of the substrate, filling the buried mask with a fill material, providing a top mask including first template openings, each template opening being arranged above one of the first regions, and a second template opening above the second region, and etching the fill material and the interlayer to form contact trenches above the first and second regions.

The above and still further features and advantages will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIGS. 2A-2F: are planar views and corresponding cross-sectional views of a first and a second section of a substrate which show an exemplary embodiment of a method of manufacturing a contact arrangement after providing an interlayer.

FIGS. 3A-3F are plan views and corresponding cross-sectional views of a first and second section of a substrate which show an exemplary embodiment of a method of manufacturing the contact arrangement of FIGS. 2A-2F after etching a contact trench.

FIGS. 6A-6F are plan views and corresponding cross-sectional views of a first and second section of a substrate which show an exemplary embodiment of a method of manufacturing the contact arrangement of FIGS. 2A-5F after patterning the buried mask layer.

FIGS. 7A-7F are plan views and corresponding cross-sectional views of a first and second section of a substrate which show an exemplary embodiment of a method of manufacturing the contact arrangement of FIGS. 2A-6F after providing a fill material.

FIGS. 8A-8F are plan views and corresponding cross-sectional views of a first and second section of a substrate which show an exemplary embodiment of a method of manufacturing the contact arrangement of FIGS. 2A-7F after providing the top mask.

FIGS. 9A-9F are plan views and corresponding cross-sectional views of a first and second section of a substrate which show an exemplary embodiment of a method of manufacturing the contact arrangement of FIGS. 2A-8F after etching contact trenches.

FIGS. 10A-10F are plan views and corresponding cross-sectional views of a first and second section of a substrate which show an exemplary embodiment of a method of manufacturing the contact arrangement of FIGS. 2A-9F after providing contacts.

FIGS. 12A-12F are plan views and corresponding cross-sectional views of two sections of a substrate which show an exemplary embodiment of a method of manufacturing an interconnection arrangement after providing a top mask.

FIGS. 13A-13F are plan views and corresponding cross-sectional views of two sections of an integrated circuit substrate which show an exemplary embodiment of a method of manufacturing the interconnection arrangement of FIGS. 12A-12F after providing a mold layer.

FIGS. 14A-14F are plan views and corresponding cross-sectional views of two sections of a substrate which show an exemplary embodiment of a method of manufacturing the interconnection arrangement according of FIGS. 12A-13F after etching line and contact trenches.

FIGS. 15A-15F are plan views and corresponding cross-sectional views of two sections of a substrate which show an exemplary embodiment of a method of manufacturing the interconnection arrangement of FIGS. 12A-14F after formation of interconnection lines and contacts.

FIGS. 16A-16F are plan views and corresponding cross-sectional views of a further exemplary embodiment of two sections of an integrated circuit.

DETAILED DESCRIPTION

Methods are described herein for manufacturing a contact arrangement and for manufacturing an interconnection arrangement using a buried mask and a top mask. Also described herein are a contact arrangement and an interconnection arrangement as well as an integrated circuit and an electronic system comprising in each case a contact arrangement.

An embodiment provides a method of manufacturing a contact arrangement. An interlayer is disposed on a substrate that comprises first regions being arranged along a row direction and a second region. A buried mask may be provided that includes a first trim opening above the first regions and a second trim opening above the second region. The buried mask may be filled with a fill material. A top mask may be provided that includes first template openings, wherein each first template opening is arranged above one of the first regions. The top mask may further comprise a second template opening above the second region. The fill material and the interlayer are etched to form contact trenches above the first regions and the second region.

Although embodiments are described herein relating to Floating Gate-Type memory cells and NAND-architecture, it is noted that the invention is not limited to such embodiments. Rather, invention also encompasses additional embodiments such as, for example, NOR-architectures or Trapping-Layer memory cells or even other memory types (e.g., DRAMs, MRAMs, F$_C$RAMs, PCRAMs).

Figure 1:
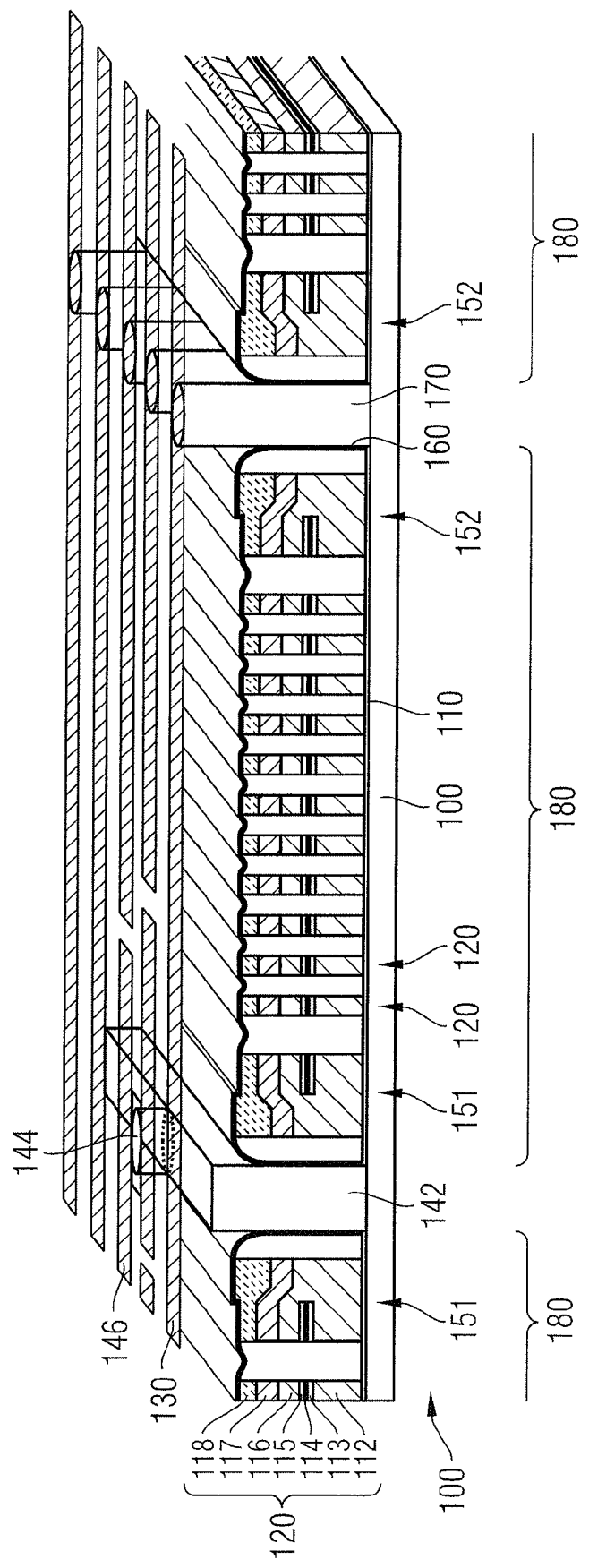
FIG. 1 is a schematic perspective view of a non-volatile NAND memory cell array comprising floating-gate memory cells and an interconnection arrangement.
Figures 4A, 4B:
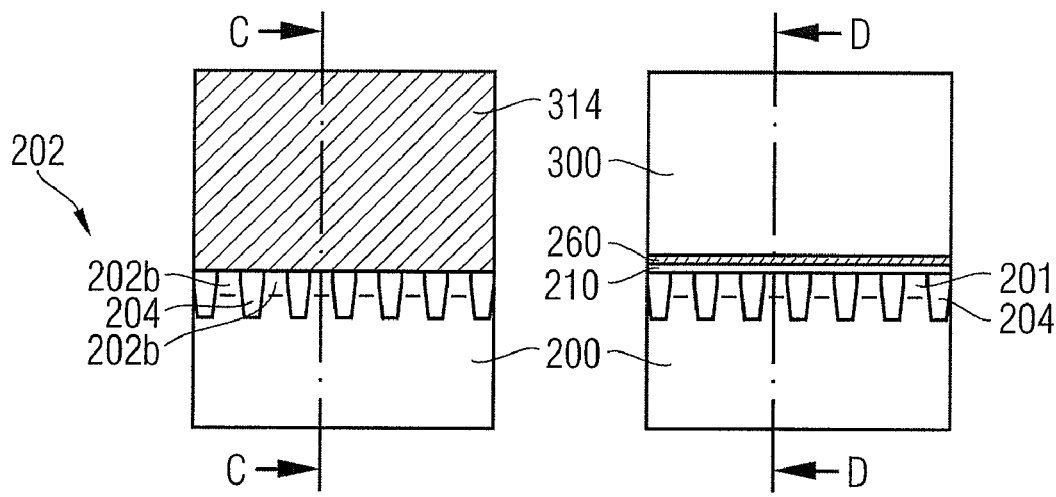
FIGS. 4A-4F are plan views and corresponding cross-sectional views of a first and second section of a substrate which show an exemplary embodiment of a method of manufacturing the contact arrangement of FIGS. 2A-3F after providing a source line shunt.
Figures 4C, 4D:
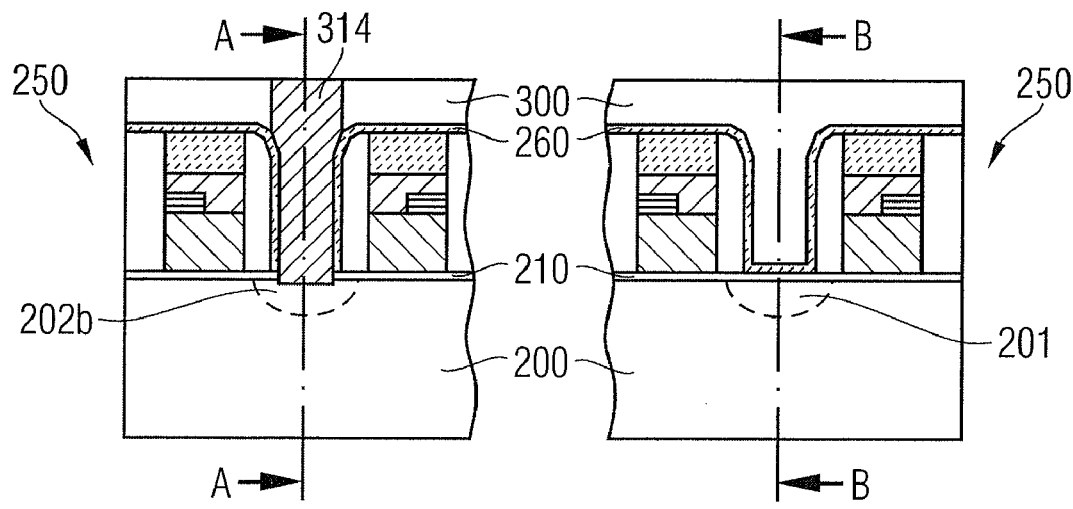
Figure 4E:
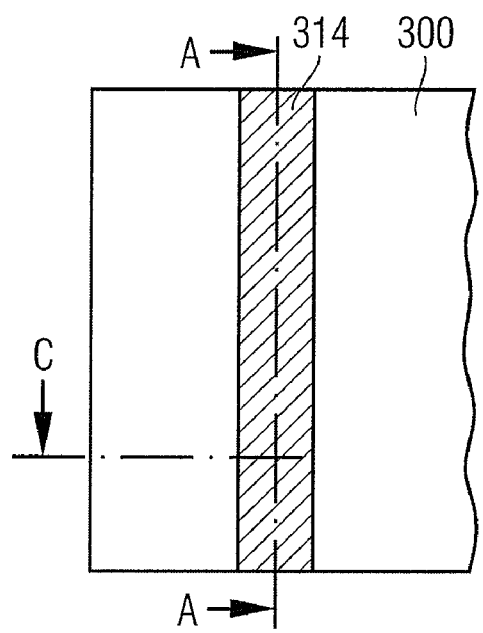
Figure 4F:
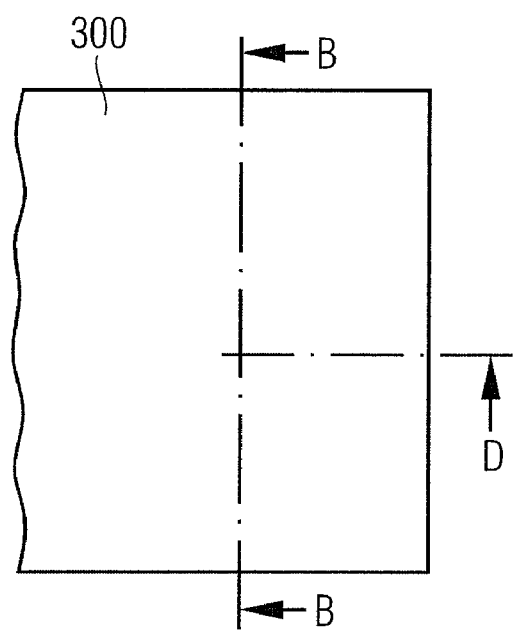
Figure 5A:
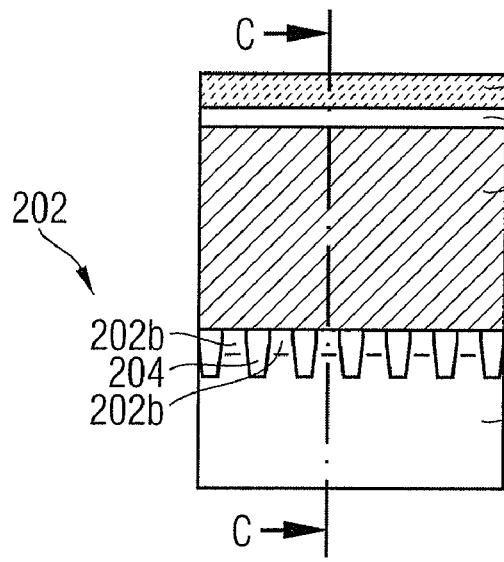
FIGS. 5A-5F are plan views and corresponding cross-sectional views of a first and second section of a substrate which show an exemplary embodiment of a method of manufacturing the contact arrangement of FIGS. 2A-4F after providing a buried mask layer.
Figure 5B:
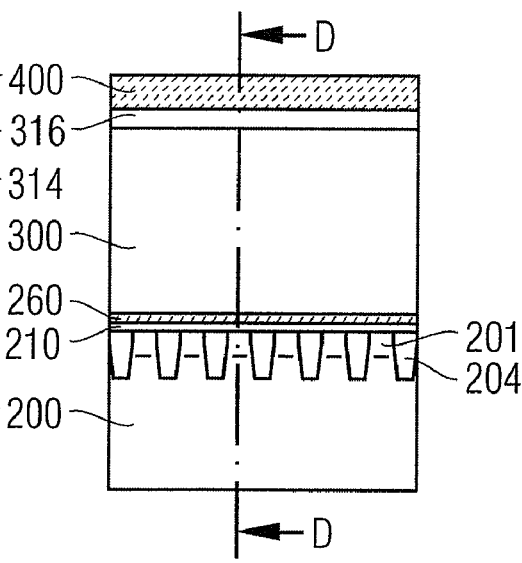
Figure 5C:
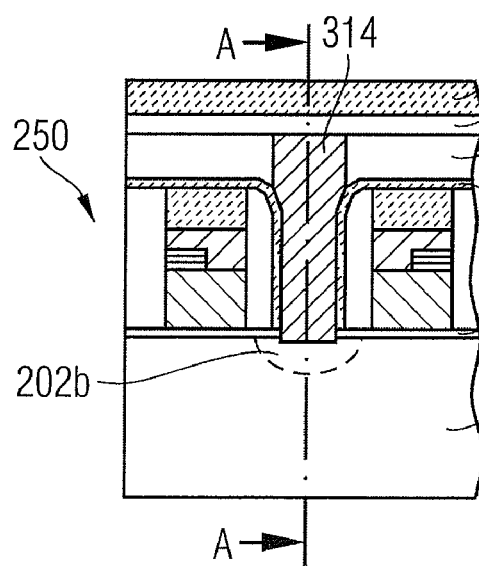
Figure 5D:
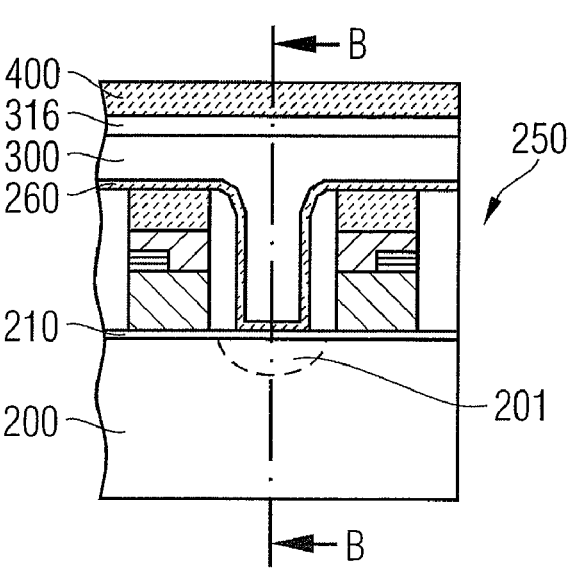
Figure 5E:
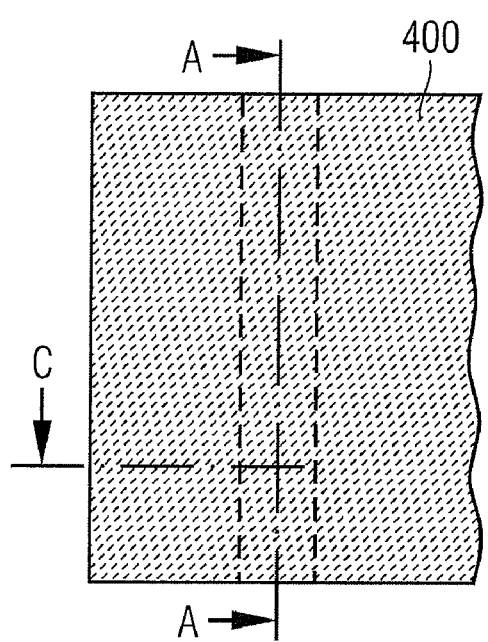
Figure 5F:
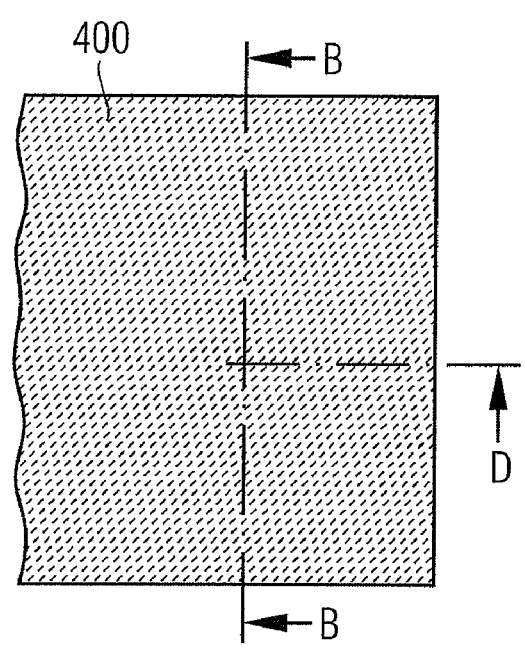
Figure 6A:
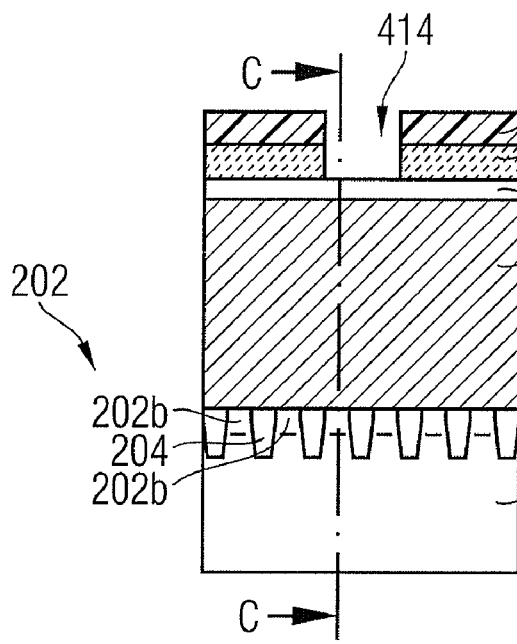
Figure 6B:
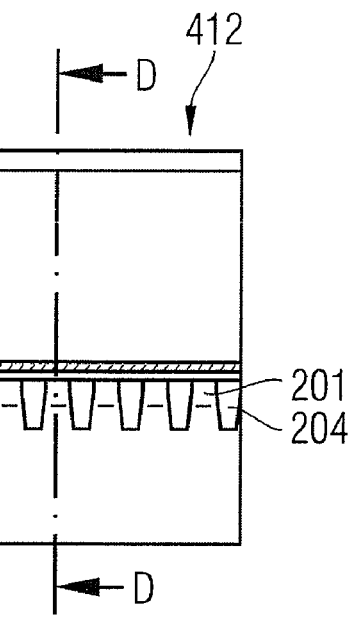
Figures 6C, 6D:
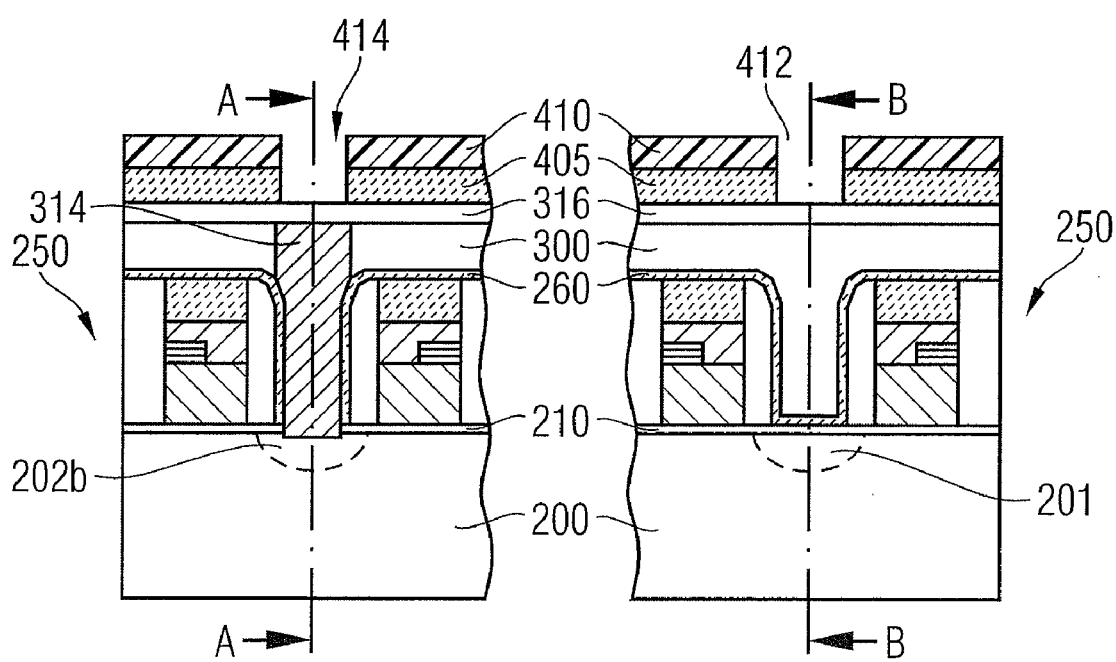
Figure 7A:
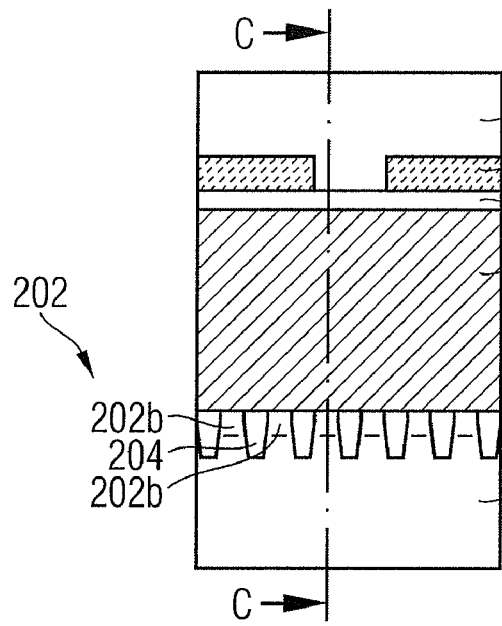
Figure 7B:
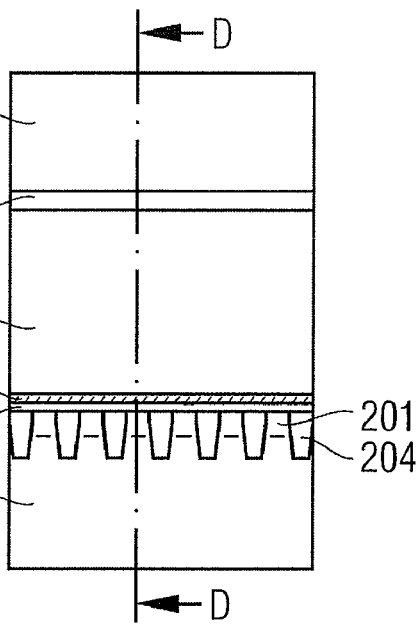
Figure 7C:
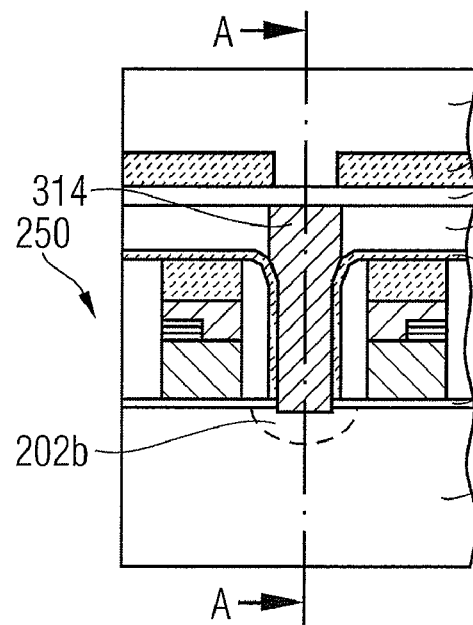
Figure 7D:
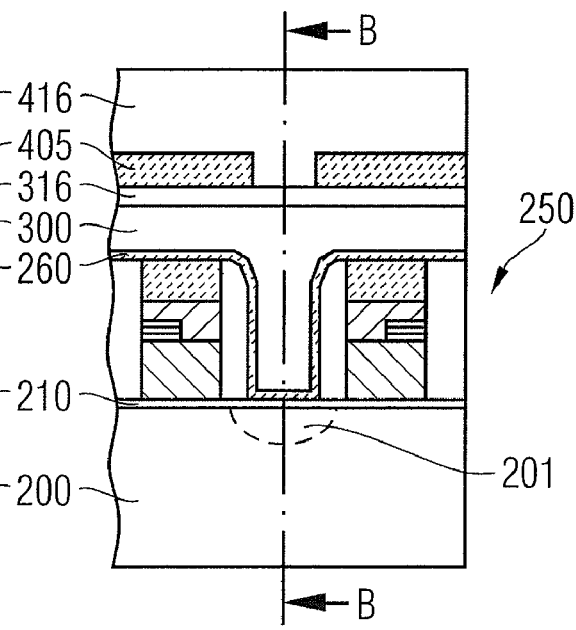

FIG. 1 schematically depicts a section of a NAND-type flash memory device with floating gate memory cells. Each memory cell comprises a gate stack 120 and an active region formed within a substrate 100. A barrier layer 110 separates in each case the gate stack 120 and the substrate 100. Each gate stack 120 comprises further an insulated storage layer 112 which forms the floating gate and is, for example, a polysilicon layer. The storage layer 112 is sandwiched between the barrier layer 110 and a barrier system, which may comprise a nitride liner 114 sandwiched between two silicon oxide liners 113, 115. According to other embodiments, the barrier system 113, 114, 115 may be a single liner or comprise other liner materials. A gate layer 116, which may be a polysilicon layer, may be disposed on the barrier system 113, 114, 115. The gate stack 120 may further comprise a metal layer 117, which may be a tungsten layer and further barrier and adhesive layers between the metal layer 117 and the gate layer 116. An insulating cap layer 118, which may be a silicon nitride layer, may be disposed on top of the metal layer 117.

Groups of memory cells are arranged along a bit line direction and form in each case a NAND string 180. An etch stop liner 160 may cover the NAND strings 180. First select transistors 151 connect the NAND strings 180 to a buried source line in the substrate 100. A source line shunt 142 may be disposed on the buried source line. The source line shunt 142 is arranged between gate stacks of two first select transistors 151 of neighboring NAND strings 180 that are arranged along a bit line direction.

Source line vias 144 may connect the source line shunt 142 to a connection line 146 that may be formed in a connection plane of the NAND-type flash memory. The source line shunt 142 is connected to a plurality of neighboring NAND strings 180. A second select transistor 152 connects the NAND string 180 to a corresponding bit line contact 170. The bit line contacts 170 of neighboring NAND strings 180 are connected to bit lines 130 that may be formed in the same connection plane as the connection lines 146. Both connection and bit lines 146, 130 may run along the bit line direction. The bit line contacts 170 may have a width and a length in each case equal to a minimum lithographic feature size "F" for evenly spaced lines. As the bit line contacts 170 have no equivalent neighboring structures in the bit line direction, resolution enhancement techniques are difficult to apply. The requirements concerning the formation of the bit line contacts 170, the source line shunts 142 and the source line vias 144 may differ from each other.

FIGS. 2A to 10F refer to a method of manufacturing a contact arrangement comprising dense contact chains and an isolated contact. The contact chain may be, for example, a row of bit line contacts and the isolated contact a source contact of a memory cell array. The memory cell array may be, for example, a NAND-type flash memory device.

The figures described below that are designated by "F" refer in each case to a plan view of a first section of a substrate 200 and the figures designated by "E" refer in each case to a plan view of a second section of the substrate 200. The first section may include first regions 201 arranged along the cross section B-B. The first regions 201 may be impurity regions forming bit line terminals of a NAND string and may be separated by insulator structures 204. The second section may include a second region 202. The second region 202 may be another impurity region forming source line terminals of a NAND string. The figures designated by "A", "B", "C" and "D" illustrate the cross-sections along the lines A-A, B-B, C-C, D-D as depicted in the figures designated by "E" and "F". The cross-sections C-C and D-D run along a first direction, which may be a bitline direction of a NAND flash memory and the cross-sections A-A and B-B along a second direction perpendicular thereto. Although FIGS. 2A-2F to 10A-10F are described in context with a method of manufacturing a contact arrangement, they may also be part of a method of manufacturing an interconnection arrangement. Though FIGS. 2A-2F to 10A-10F are described in context with a NAND flash memory device, the method described in relation to these figures is also applicable for other semiconductor devices comprising dense contact chains and isolated contacts.

Referring to FIGS. 2A to 2F, a substrate 200 is provided. The substrate may be a single crystalline semiconductor substrate as for example a silicon wafer and may include other layers that have previously been fabricated. The substrate may comprise doped and undoped sections, epitaxial semiconductor layers supported by a base semiconductor or a base insulator as well as other semiconductor and insulator structures. According to an exemplary embodiment, gate stacks 250 of NAND-type memory cells and select transistors may be provided above the substrate 200. The gate stacks 250 may comprise a storage layer 224, which may be polysilicon layer. A gate layer 230, which may be a polysilicon layer may be at least partially in contact with the storage layer 224 in case of select transistors. Due to mask overlay tolerances, the gate stacks 250 of the select transistors may comprise portions of a barrier system 226 that insulates the gate layer 230 and the storage layer 224 in the gate stacks of the NAND-type memory cells. A barrier layer 210, for example a silicon oxide layer, may be disposed between the substrate 200 and the gate stacks 250. Insulating sidewall spacers 245, which may be silicon oxide spacers, may extend along vertical sidewalls of the gate stacks 250. An etch stop liner 260, which may be, for example, a silicon nitride or silicon oxynitride liner, and which may have a thickness of 1 to 15 nm, may cover the gate stacks 250 and sections of the substrate 200 between the gate stacks 250. The substrate 200 includes first regions 201 being arranged along a first axis along cross-sectional plane B-B in the first section and at least a second region 202 extending along the first axis in the second section. The first regions 201 may be evenly spaced at a pitch of 2F. An interlayer 300 may fill the spaces between the gate stacks 250 and may cover the gate stacks 250 to provide a plane surface. The first axis will be referred to as row axis in the following figures.

Referring to FIGS. 3A-3F, a resist layer may be deposited on the interlayer 300 and may be patterned by photolithographic techniques to form a stripe resist mask 310, with a stripe opening above the second region 202.

Using the stripe resist mask 310 as an etch mask, an etch process may be performed that etches the interlayer 300 selectively against the etch stop liner 260 and the stripe resist mask 310. An anisotropic etch of a section of the etch stop liner 260 covering the second region 202 may follow to form a stripe opening 312 in the interlayer 300, wherein the stripe opening 312 exposes the second region 202 and may extend between neighboring source select transistors of two NAND-strings that share a common source line.

According to FIGS. 4A-4F, the stripe opening 312 may be filled with a conductive material, such as tungsten to provide a source line shunt 314 in the stripe opening 312. A titanium nitride liner lining the bar opening 312 may be provided prior to the tungsten fill. As shown in FIGS. 5A-5F, a spacer layer 316, for example a silicon oxide layer, may be provided that covers the interlayer 300 and the source line shunt 314. A mask layer 400 is deposited above the interlayer 300 and the source line shunt 314, for example on the spacing layer 316. The mask layer 400 is, according to an exemplary embodiment, a silicon nitride layer.

Referring to FIGS. 6A-6F, a further resist layer may be deposited and patterned by photolithographic techniques to form a trim resist mask 410. Using the trim resist mask 410 as etch mask, a first trim opening 412 may be formed above the first regions 201 and second trim openings 414 may be formed above the source line shunt 314 in the same mask layer 400 to form a buried mask 405 from the mask layer 400.

As shown in FIG. 6E, the second trim openings 414 are formed above the source line bar 314. Referring to FIG. 6F, the first trim opening 412 extends above the first regions 201 along the row axis. The width of the first trim opening may correspond to F. Either width or length of the isolated second trim opening 414 or both width and length may exceed F.

As shown in FIGS. 7A-7F, the trim resist mask 410 is removed and a fill material 416 is deposited which fills the first and second openings 412, 414 and which may cover the buried mask 405. The fill material 416 is, by way of example, the same as that of the interlayer 300, for example a silicon oxide, and may provide a plane surface.

Referring to FIGS. 8A-8F, a top mask layer, which may be an amorphous carbon layer, is provided on the fill material 416. An auxiliary layer, for example a silicon nitride layer may be disposed on the top mask layer and may be patterned by photolithographic techniques. The pattern may be transferred into the top mask layer to form a top mask 500 with first template openings 512 and at least one second template opening 514. A protective layer 502, for example a silicon oxynitride layer, may cover the top mask 500.

Figure 8E:
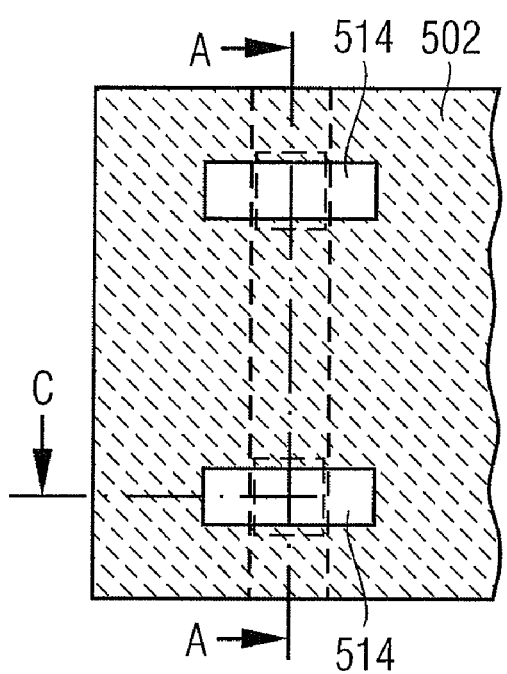
Figure 8F:
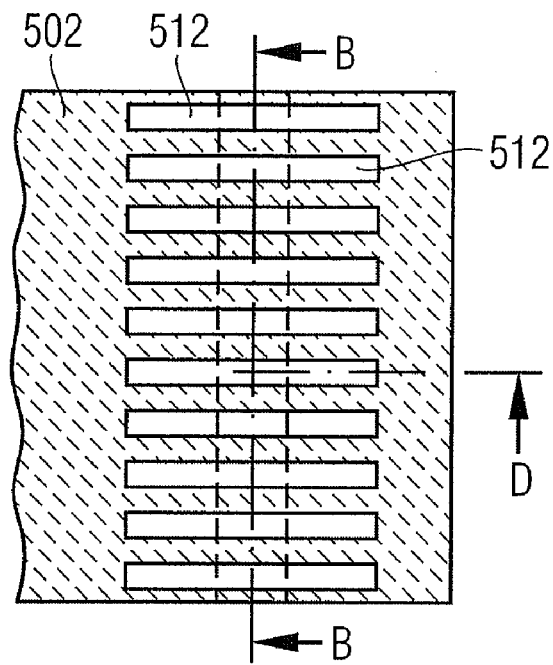
Figure 10A:
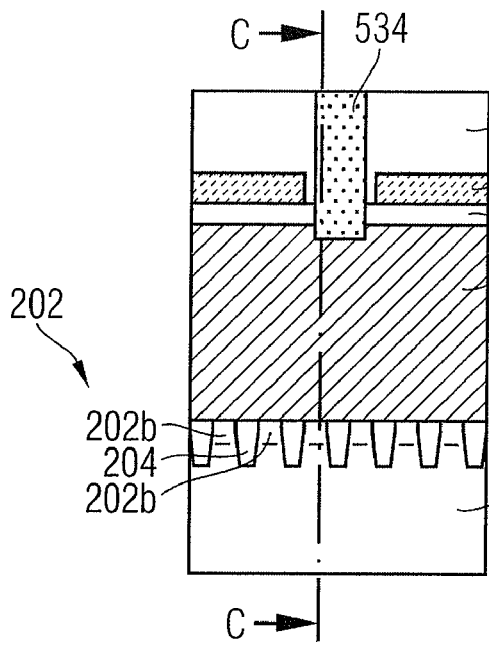
Figure 10B:
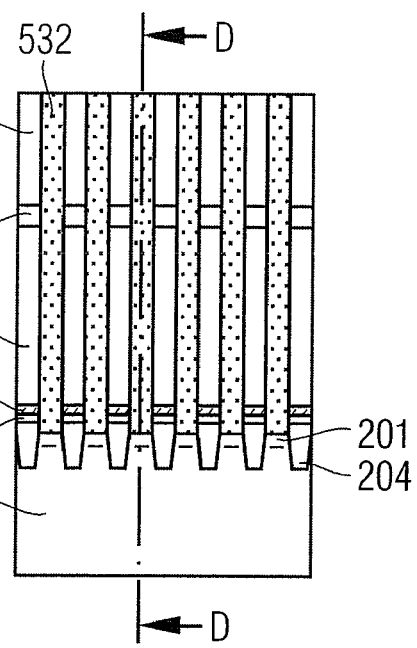
Figure 10C:
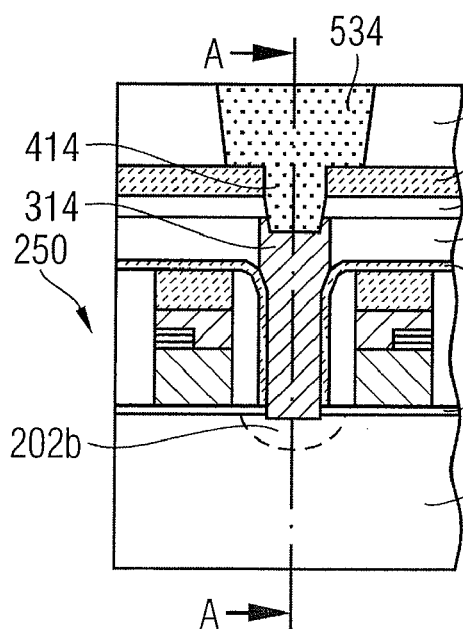
Figure 10D:
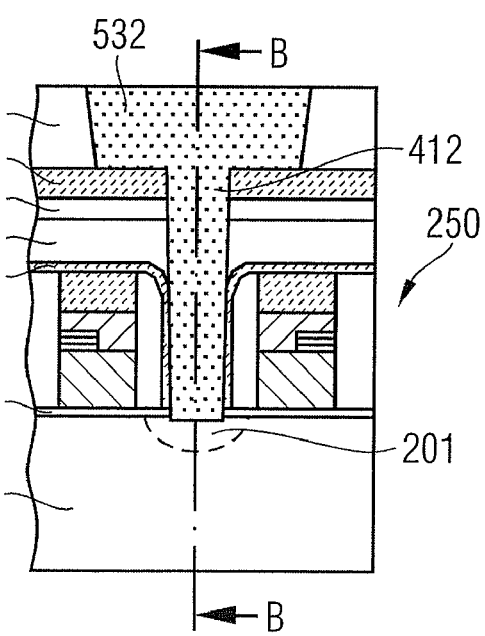

As shown in FIG. 8E, the second template openings 514 extend along a second axis which may intersect the row axis perpendicularly and cross the second trim opening 414 above the source line shunt 314. The first template openings 512 may extend also along the second axis and cross in each case one of the first regions 201 above the first trim opening 412. As the first template openings 512 may be arranged at the minimum pitch that may be achieved at a nominal minimum lithographic resolution F, for example at a pitch of 2F, and as further the first template openings 512 lack of suitable neighboring structures, the length of the template openings 512 is typically about 4 to 5 times the width.

Referring to FIGS. 9A-9F, the fill material 416, the spacer layer 316, and the interlayer 300 may be etched step-by-step or in a single step. During the etch, the top mask 500 may be consumed at least partly. Residual portions of the top mask 500 may be removed after the etch. In the second section of the substrate 200, contact trenches 524 are formed that may extend between the upper edge of the fill material 416 and the upper edge of the source line shunt 314. The second template opening 514 may define along the row axis a width W2 of a bottom portion 524a of a second contact trench 524 below the buried mask 405. Along the second axis, the second trim opening 414 may define a length L2 of the bottom portion 524a.

Referring to FIGS. 9B, 9D and 9F, the length L1 and the width W1 of bottom portions 522a of first contact trenches 522 below the buried mask 405 are determined by the width of the first trim opening 412 along the second axis and by the width of the template openings 512 along the row axis.

The buried mask 405 controls etching of the bottom portions 522a, 524a of the contact trenches 522, 524 and may protect structures adjoining the first regions 201 and the second region 202, as for example the gate structures 250. The buried mask defines the dimension of the bottom portion 522a. The distance between neighboring gate structures may therefore correspond substantially to the width of the first trim opening (trim width) which is significantly smaller than a minimum length of the template openings 512.

Referring to FIGS. 10A-10F, a titanium or titanium nitride liner may be deposited to line the first and second contact trenches 522, 524. A conductive material such as tungsten may be deposited to fill the contact trenches 522, 524, wherein first and second contacts are formed in the corresponding contact trenches 522, 524. The first contacts may be bit line contacts 532 and the second contacts source line contacts 534. A chemical mechanical polishing step may be performed to remove deposited tungsten from the upper surface of the fill material 416. The source line shunt may minimize a voltage drop of the source voltage between adjacent NAND-strings.

FIGS. 11A-11F show a contact arrangement of an integrated circuit according to an embodiment. First regions 801 and second regions 802 are provided in a first section and a second section of a substrate 800 respectively. The first regions 801 are arranged along a row axis, which is parallel to the cross-sectional line B-B, and may be separated by insulator structures 804. The substrate 800 may be a p-doped single crystalline silicon substrate. The first and second regions 801, 802 may be active areas, for example n-doped impurity regions forming source/drain-regions of transistors or conductive terminal structures. The first regions 801 may be evenly spaced at a pitch 2F, wherein F corresponds to a minimal feature size that is achievable for evenly spaced lines by resolution enhancement techniques. The first and second regions 801, 802 may adjoin a substrate surface of the substrate 800.

The contact arrangement may further comprise a contact 823, for example a source line shunt, which is in contact with the second region 802. The source line shunt may minimize a voltage drop of the source voltage between adjacent NAND-strings. An interlayer 810 is arranged above the substrate 800. The upper edge of the interlayer 810 may be flush with an upper edge of the contact 823. The interlayer 810 may be a dielectric layer, for example a silicon oxide layer. A buried mask 840 is arranged above the contact 823 and the interlayer 810. The buried mask 814 comprises a first trim opening 818 and a second trim opening 820. The first trim opening 818 extends above the first regions 801 along the row axis. The second trim opening 820 is formed above the contact 823. The buried mask 814 may be formed from a dielectric material, against which the dielectric material of the interlayer may be etched with high selectivity. The buried mask 814 may be a silicon nitride mask or a silicon oxynitride mask. A fill material 814 fills partially the first and second trim openings 818, 820. Further portions of the fill material 816 may form a fill material layer covering the buried mask 814.

The contact arrangement further comprises first contacts 821. Each first contact 821 comprises a bottom portion 821a extending from the upper edge of the buried mask 814 to the substrate surface of substrate 800, wherein each first contact 821 is in contact with one of the first regions 801.

Figure 11A:
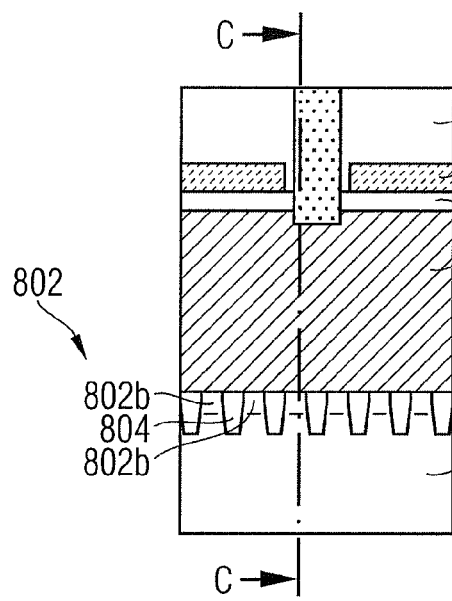
FIGS. 11A-11F are plan views and corresponding cross-sectional views of another embodiment of two sections of an integrated circuit.
Figure 11B:
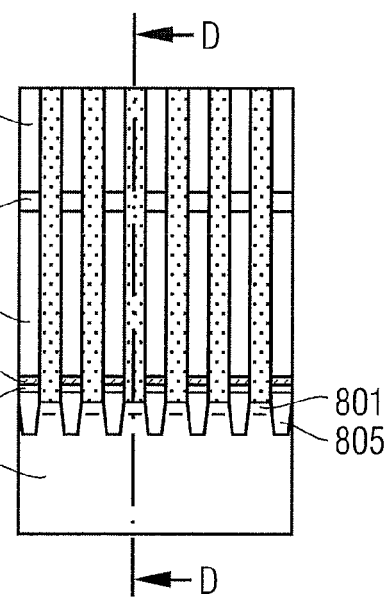
Figure 11C:
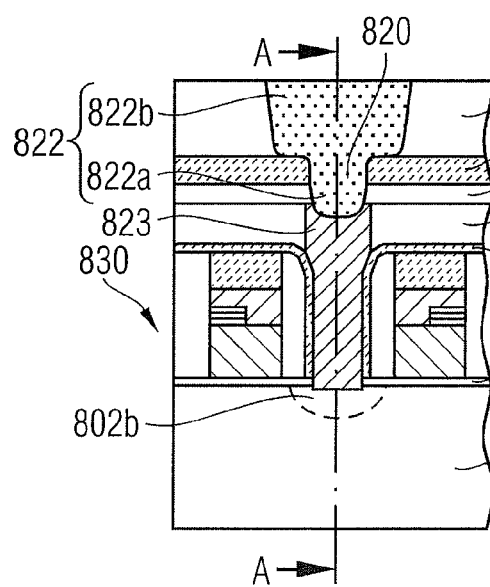
Figure 11D:
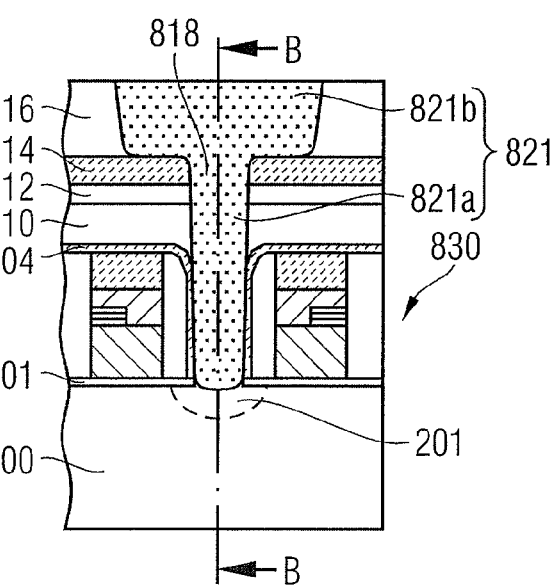
Figure 11E:
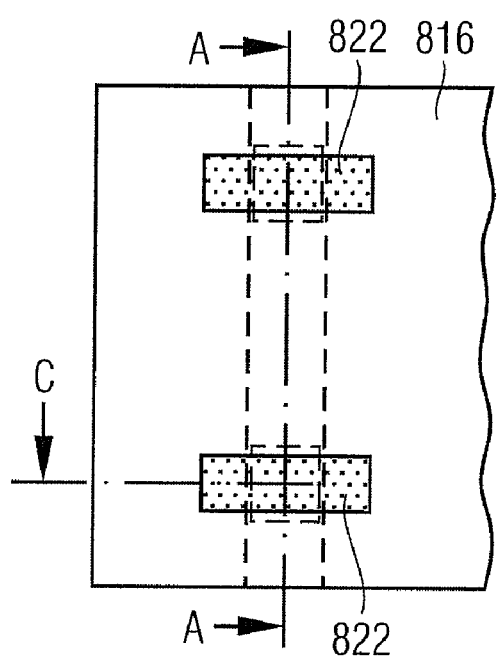
Figure 11F:
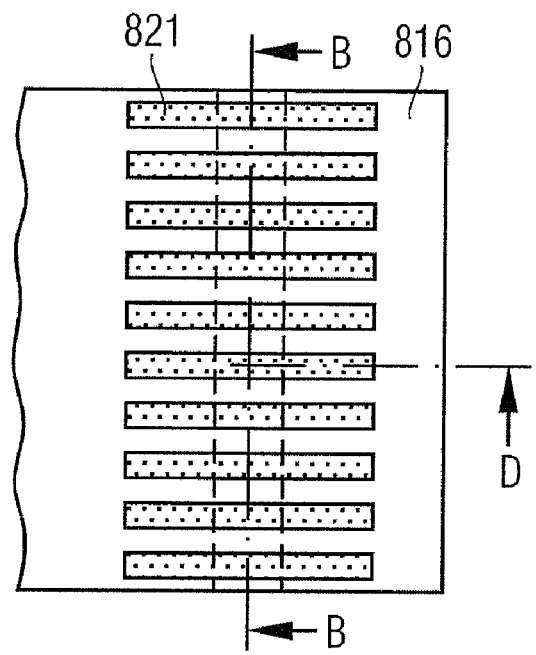
Figures 12A, 12B:
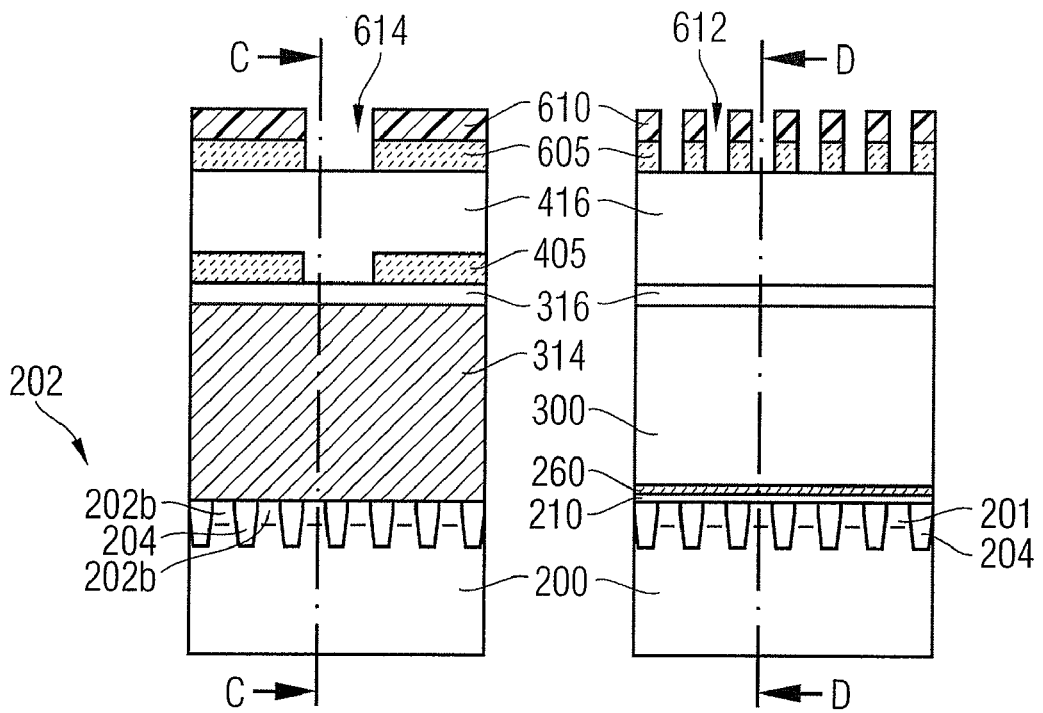
Figures 12C, 12D:
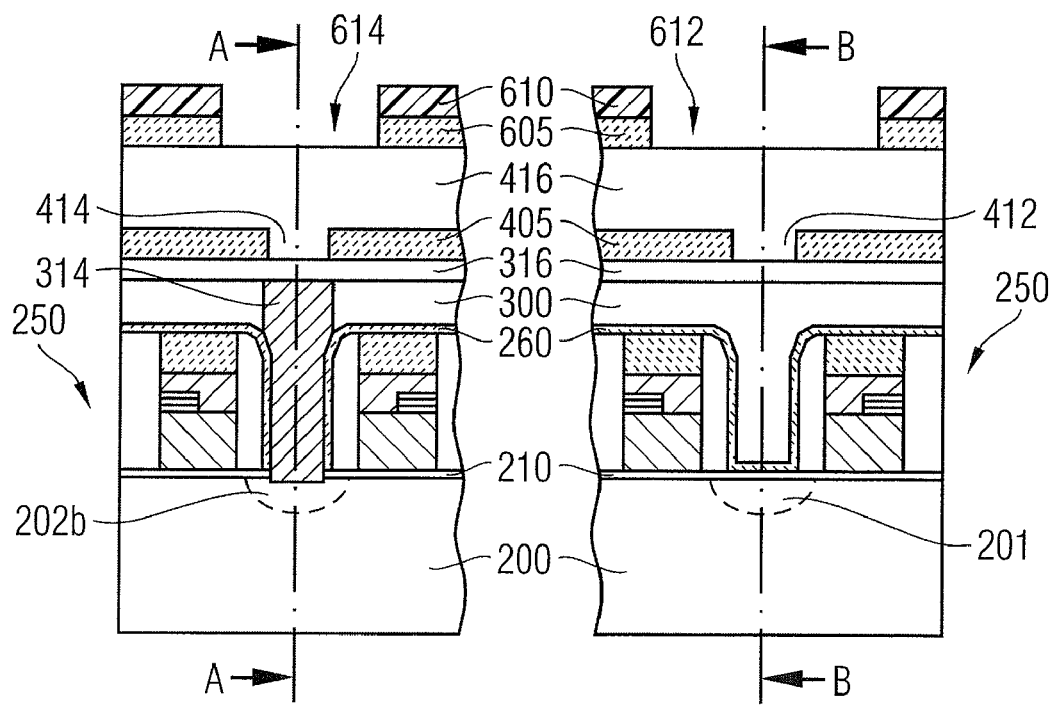
Figures 13A, 13B:
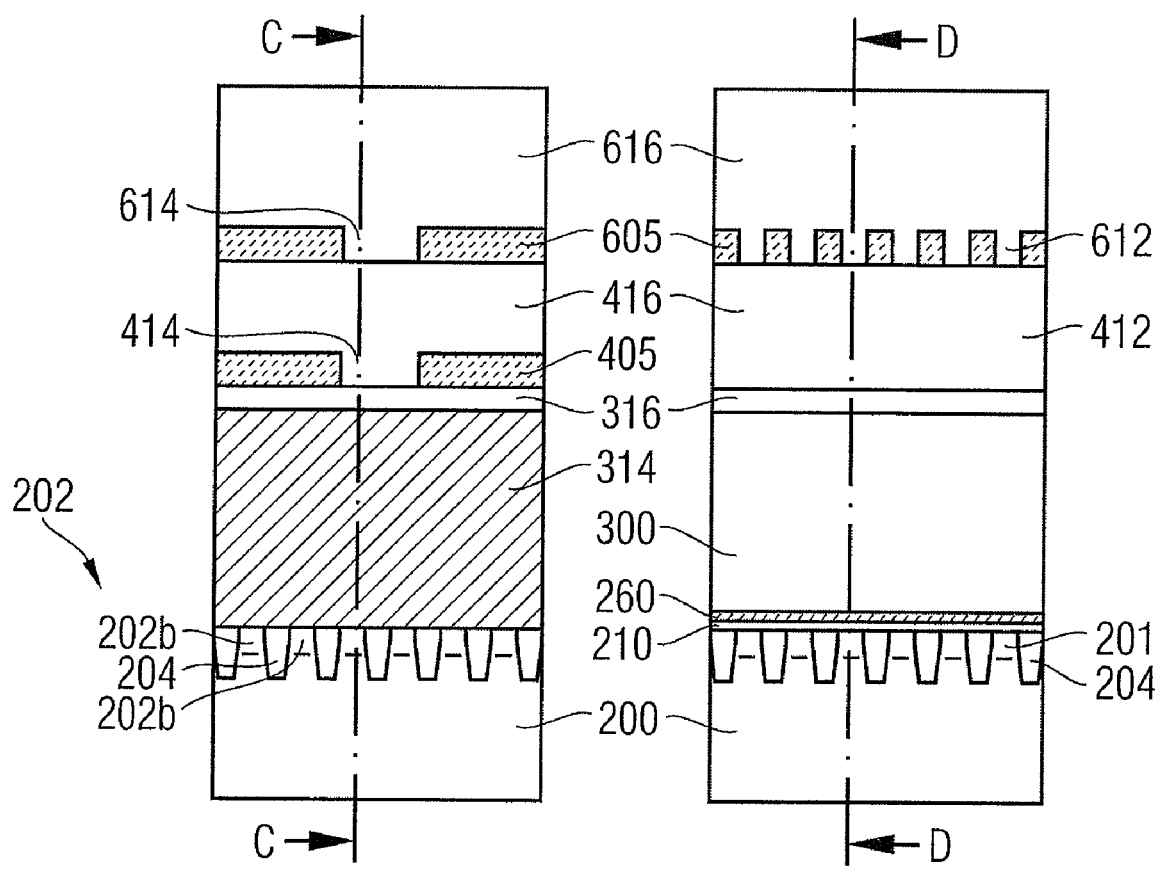

The buried mask 814 is in contact with each of the first contacts on two opposing sides along a first axis. Along a second axis, which is perpendicular to the first axis, portions of the fill material 814 separate the first contacts 821 from each other. The first axis may be, as shown in FIGS. 11C-11D, perpendicular to the row axis. According to another embodiment, the first axis is parallel to the row axis.

An upper portion 821b of the first contacts 821 may extend above the buried mask 814 and may bear in portions on the buried mask 814. The upper portions 821b of the first contacts 821 may cross the row axis, for example perpendicularly. A length of the upper portions 821b may be 4 to 5 times the width thereof. The pitch of the first contacts 821 is equivalent to the pitch of the first regions 801. The top dimensions of the first contacts 821 are enlarged with regard to the dimensions of the first regions and requirements for further structures contacting the first contacts 821 from a further interconnection plane are relaxed.

Accordingly, each second contact 822 comprises at least a bottom portion 822a extending between the upper edge of the buried mask 814 and the upper edge of the contact 823. The bottom portion 822a is in contact with the buried mask 814 on two opposing sides along a first axis, which may be an axis perpendicular to the row axis. Along an axis perpendicular to the first axis, for example the row axis, portions of the fill material 814 separate the second contact 822 and the buried mask 814. An upper portion 822b of the second contact 822 may bear partly on the lower portion 822a and the buried mask 814.

The integrated circuit may further comprise gate electrode structures 830 extending on opposing sides along the contact rows. The gate electrode structures 830 may be assigned to, for example, selection transistors of NAND strings. An etch stop liner 804 may cover the gate electrode structures 830 and a barrier layer 801 may separate the gate electrode structures 830 and the substrate 800.

The trim openings 818, 820 direct the etch of the contact trenches between the gate electrode structures 830 which are shielded by the buried mask 814. Thus, by way of example, the distance between neighboring NAND-strings may be reduced to the minimum feature size F to save substrate area. The buried mask 814, which may be a silicon nitride mask, may shield, by way of example, floating gate or trapping layer memory cells against UV-radiation, caused by plasma enhanced processes performed in course of further processing of the integrated circuit. UV-radiation may generate charge carriers precharging the floating gates or the trapping layers and shifting the initial threshold voltage of the memory cells to higher values.

The material of the first and second contacts 821, 822 may be any conductive material such as heavily doped polysilicon or a metal layer system. For example, the contacts 821, 822 may comprise a titanium nitride liner lining the sidewalls of the contacts 821, 822 and tungsten in the rest.

FIGS. 12A-15F illustrate a method of manufacturing an interconnection arrangement. An interlayer 416 covering first regions 201 in a first section of a substrate 200 is provided as shown in FIGS. 12A-12F. Above a second region 202 in a second section of the substrate 200, a contact structure 314 which may be a source line shunt of a NAND memory cell array may be provided. A buried mask 405 including a first trim opening 412 crossing above the first regions 201 and second trim openings 414 above the contact structure 314 is provided. The buried mask 405 is filled with a fill material 416. Above the fill material 416, which may form a fill material layer above the buried mask 405, a buried template mask 605 may be provided. The buried template mask 605 may be provided using a template resist mask 610, which is patterned by photolithographic techniques. Using the template resist mask 610 as an etch mask, first and second template openings 612, 614 are formed in the buried template mask 605. Remnant portions of the template resist mask 610 may be removed. In other embodiments, the buried template mask 605 is omitted.

Referring to FIGS. 13A to 13F, a mold layer 616 is deposited above the buried template mask 605, where the template openings 612, 614 are filled with the material of the mold layer 616. The template mask 605 may be provided from the same material as the buried mask 405, for example silicon nitride. The material of the mold layer 616 may be the same as the material of the interlayer 300 and the fill material 416 or a similar, for example a silicon oxide. According to other embodiments, the mold layer 616 may be disposed on the buried mask 405.

A line mask 705 is provided above the mold layer 616 as shown in FIGS. 14A to 14F. The pattern of the line mask 705 may be essentially a line/space-pattern, for example the pattern of connection lines, which may comprise first lines that are to be connected with the first regions 201 and at least a second line that is to be connected with the second region 202. The first lines may be, for example, the bit lines of a NAND memory cell array and the second line may be, for example, a source line.

Referring to FIG. 14A, line trenches 713 are formed in the mold layer 616 that end on top of the buried template mask 605. In the second section, at least one damascene etch is etched through the mold layer 616, the fill material 416 and the interlayer 300, wherein a damascene trench 714 is formed that passes the buried template mask 605 and the buried mask 405. The second template opening 614 determines the extension of the damascene trench 714 along a first axis. The second trim opening 414 determines the dimension of the damascene trench 714 along a second axis, which is perpendicular to the first axis. The damascene trench 714 in the second section of the substrate 200 exposes the contact 314.

Accordingly, in the first section of the substrate, triple damascene trenches 712 may be formed extending between the upper edge of the mold layer 616 and the upper edge of the substrate 200, where in each case one of the first regions 201 is exposed. Above the template mask 605, line trenches 713 are formed that end on the buried template mask 605. A bottom portion of the triple damascene trench 712 is formed between the upper edge of the buried mask 405 and the upper edge of the substrate 200. In the bottom portion, the dimensions of the triple damascene trench are determined along the first axis by the width of the first template openings 612 and along a second axis by the width of the first trim opening 412. The first axis may correspond to the row axis and the second axis to the bitline axis.

Figure 14C:
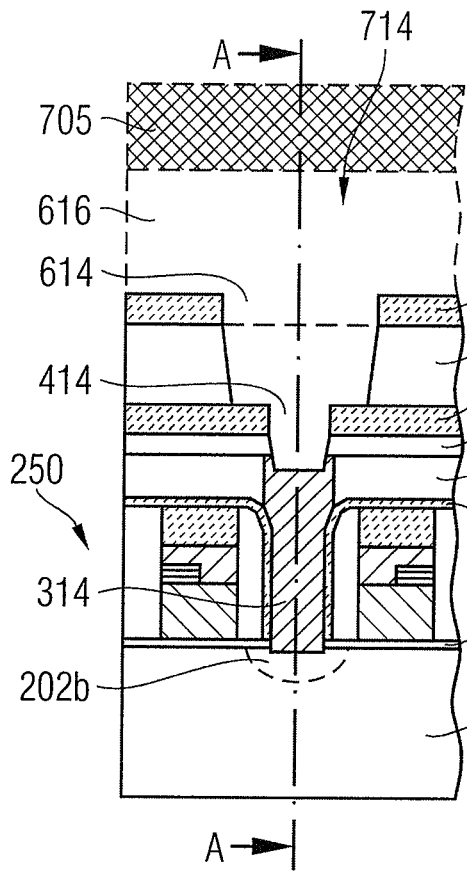
Figure 14D:
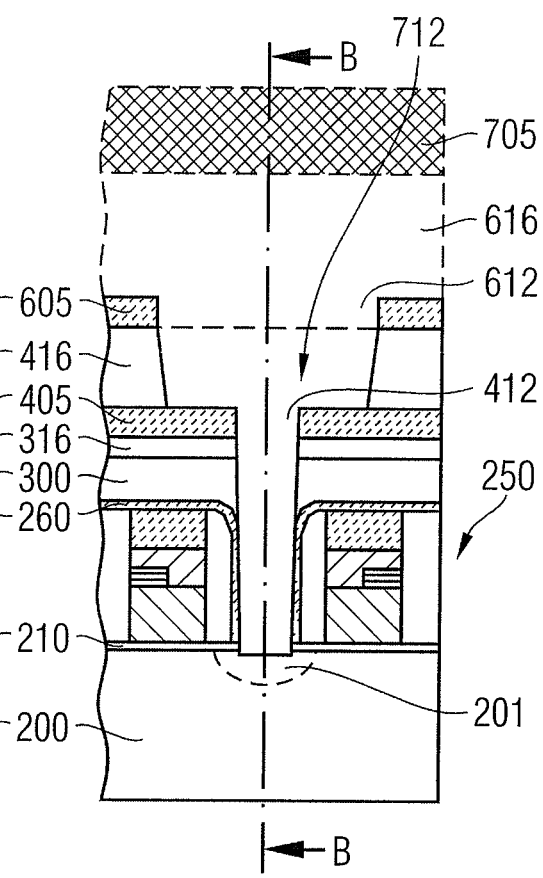
Figure 14E:
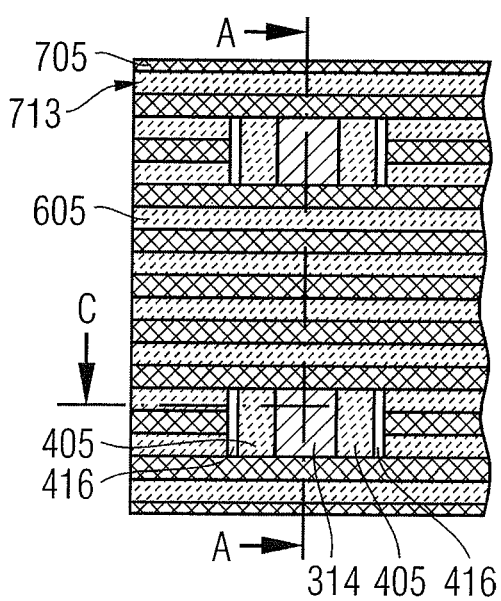
Figure 14F:
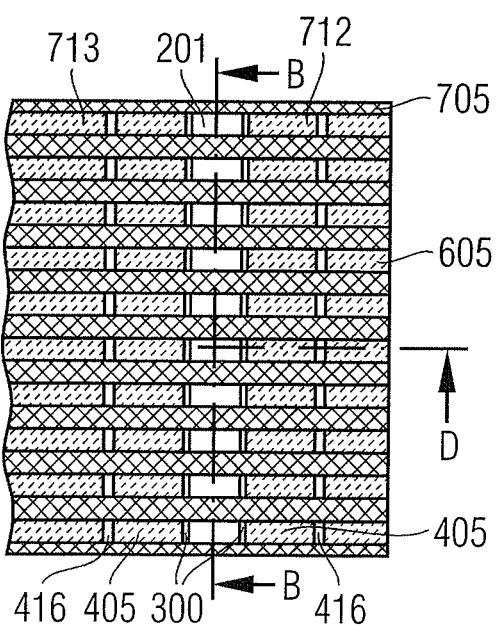
Figure 16C:
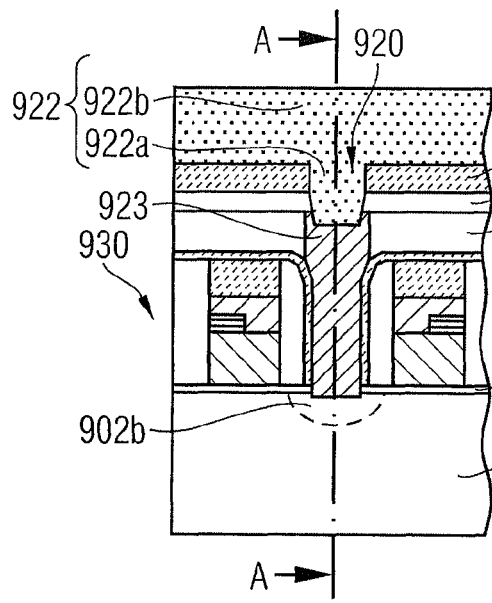
Figure 16D:
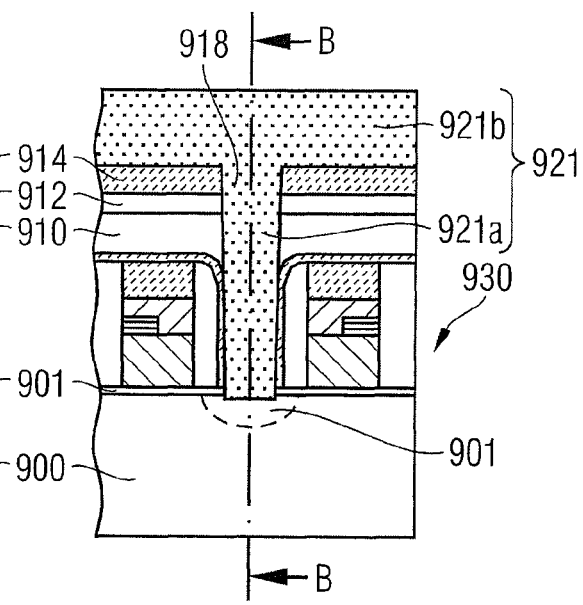
Figure 16E:
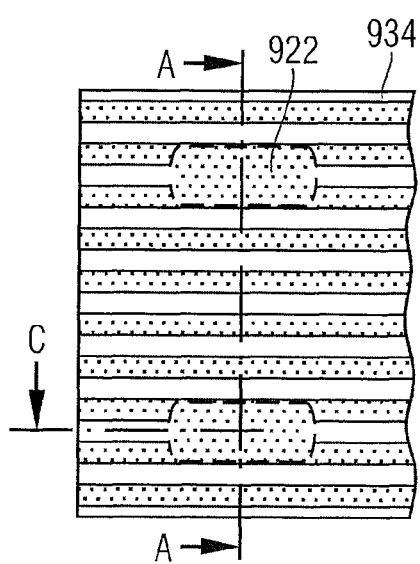
Figure 16F:
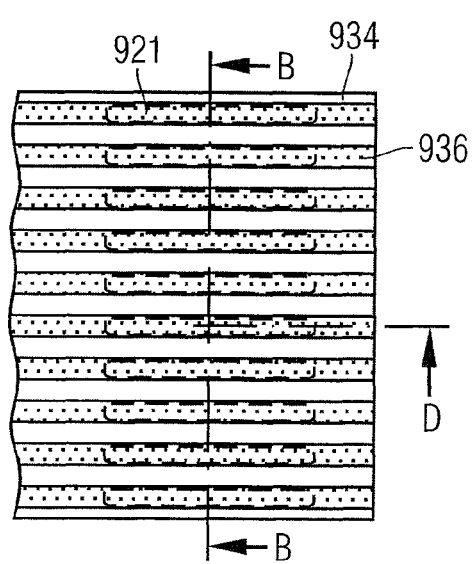

FIGS. 14C and 14D depict cross-sectional views along the dual damascene trench 714 in the second section and the triple damascene trench 712 in the first section. The dotted lines refer to the profiles of the mold layer 616 and the line mask 705 confining the intersected damascene trenches 712, 714 in a plane parallel to the cross-section plane.

Referring to FIGS. 15A-15F, the first and second damascene trenches 712 and 714 are filled with conductive material to form connection lines 723, first contacts 722 and second contacts 724. A chemical mechanical polishing (CMP) may be performed to remove portions of the conductive material being deposited outside the trenches 712-714. Remnant portions of the line mask 705 may be removed.

Above the buried template mask 605, connection lines 723 may be formed in the mold layer 616. The connection lines 723 may extend along the second axis and may form source and bit lines in a metallization plane of a NAND memory cell array. Above the contact structure 314, a further contact section 724 is formed between corresponding connection lines 723 and the contact section 314. A first dimension of the second contact section 724 along a first axis is determined by the second template opening 514 in the buried template mask 605. A second dimension along a second axis, which is perpendicular to the first axis, is determined by the second trim opening 414 in the buried mask 405.

Accordingly, in the first section of the substrate, first contacts 722 are formed between corresponding connection lines 723 and first regions 201. A first dimension of the first contact 722 along a first axis is defined by the buried template mask 605 and a second dimension along a second axis which is perpendicular to the first axis is defined by the second trim openings 414 of the buried mask 405. The first direction may be the row axis and the second direction may be the bit line axis.

FIGS. 16A to 16F show an interconnection arrangement of an integrated circuit resulting from the above described method, where the formation of the buried template mask is omitted. A substrate 900 comprises in a first section first regions 901 and in a second section second regions 902. The first regions 901 are arranged along a row axis, which is parallel to the cross-sectional line B-B. The substrate 900 may be a p-doped single crystalline silicon substrate. The first and second regions 901, 902 may be active areas, for example n-doped impurity regions forming source/drain regions of transistors or conductive terminal structures. The first regions 101 may be separated by insulator structures 904, which may be for example silicon oxide structures. The first regions 901 may be evenly spaced at a pitch of 2F, wherein F corresponds to a minimal lithographic features size for evenly spaced lines. The interconnection arrangement may further comprise a contact structure 923 arranged above the second region 902. Gate structures 930 of transistors, which may be floating gate memory cells or selection transistors, may be arranged above the substrate 900. An interlayer 910 is arranged above the substrate 900 and may bury the gate structures 930. The interlayer 910 is a dielectric layer, for example a silicon oxide layer. A buried mask 940 is provided above the contact structure 923 and the interlayer 910. The buried mask 914 comprises a first trim opening 918 and may comprise a second trim opening 920. The first trim opening 918 extends above the first regions 801 along the row axis. The second trim opening 920 is formed above the contact structure 923. The buried mask 914 may be formed from a dielectric material, against which the material of the interlayer may be etched with high selectivity. For example, the buried mask 814 is a silicon nitride mask or a silicon oxynitride mask.

The interconnection arrangement further comprises first interconnection structures 921 and may further comprise second interconnection structures 922. Each first interconnection structure 921 comprises a bottom portion 921a extending between the upper edge of the buried mask 914 and the substrate 900, wherein each bottom portion 921a is in contact with one of the first regions 901. A line portion 921b of the interconnection structure 921 is disposed within a mold layer 934 and bears in sections on the buried mask 932 and the bottom portion 921a. In a similar way, the second interconnection structure 922 comprises a line portion 922b and a bottom portion 922a, where the bottom portion 922a extends essentially between the upper edge of the buried mask 914 and the upper edge of the contact structure 923. Further portions of the mold layer 934 may fill partially the first and second trim openings 918, 920.

The buried mask 914 is in contact with each of the first interconnection structures 921 in each case on two opposing sides along a first axis. Along a second axis, which is perpendicular to the first axis, portions of the mold layer 934 separate the first interconnection structures 921 from each other. The first axis may be perpendicular to the row axis as shown in FIGS. 16A to 16D. The material of the first and second interconnections structures 921, 922 may be any conductive material such as heavily doped polysilicon or a metal layer system. For example, the interconnection structures 921, 922 may comprise a titanium nitride liner lining the sidewalls of the interconnection structures 921, 922 and tungsten in the rest.

Figure 17:
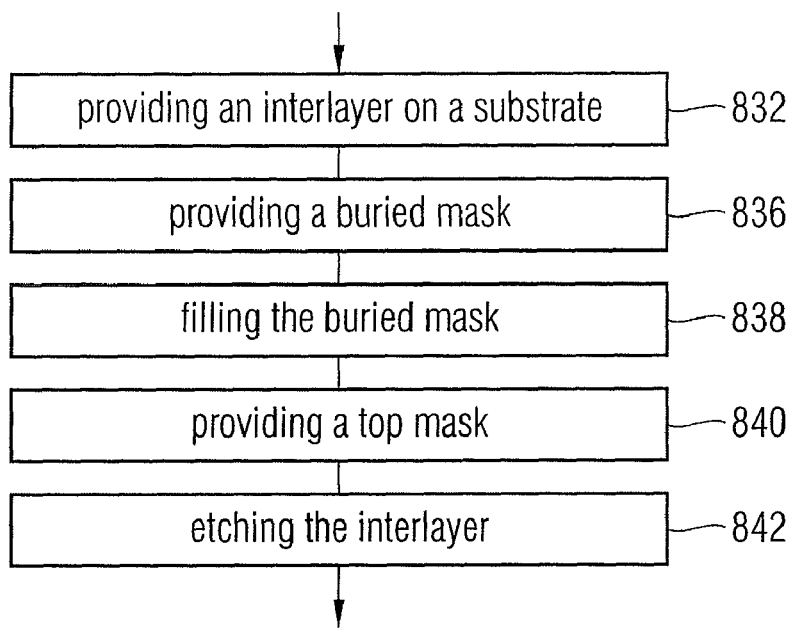
FIG. 17 is a flow chart showing an exemplary embodiment of a method of manufacturing a contact arrangement.

FIG. 17 is a flow chart illustrating a method of manufacturing a contact arrangement. The method comprises providing a substrate comprising first regions arranged along a contact row and a second region and providing an interlayer covering the first regions (832). A buried mask including a trim opening above the contact row and a second trim opening above the second region is provided (836). The buried mask is filled with a fill material (838). A top mask including first template openings crossing in each case one of the first regions and a second opening above the second region is provided (840). The fill material and the interlayer are etched to form contact trenches exposing the first and second regions (842).

Figure 18:
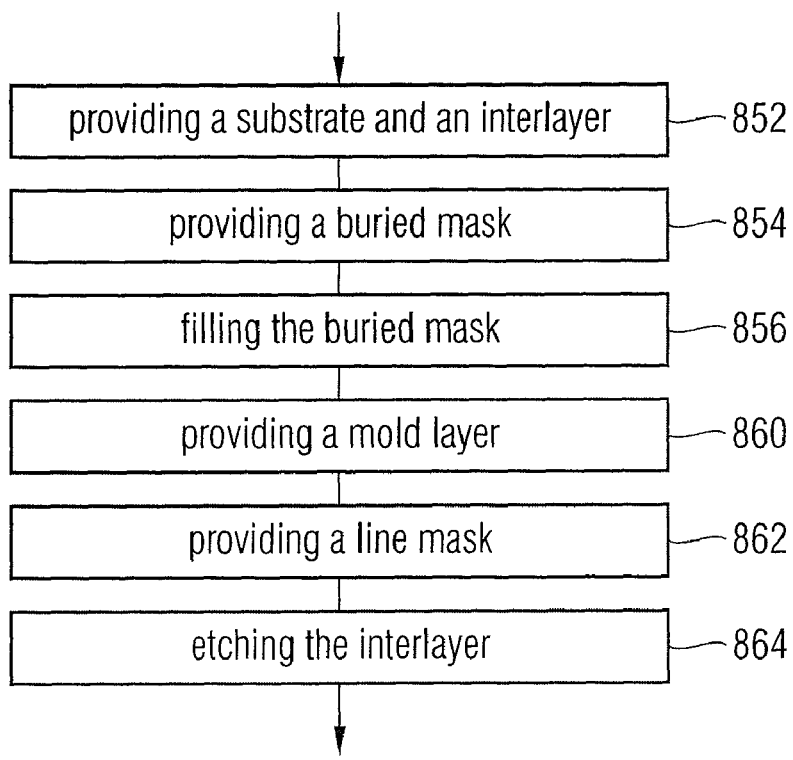
FIG. 18 is a flowchart showing an exemplary embodiment of a method of manufacturing an interconnection.

FIG. 18 is a flow chart illustrating a method of manufacturing a interconnection arrangement. An interlayer covering first regions of a substrate is provided (852). A buried mask including a first trim opening above the first region is provided (854). A mold layer is provided (860), wherein the buried mask is filled. A line mask including line openings crossing in each case one of the first regions and the first trim opening is provided (862). The interlayer and the mold layer are etched to expose the first regions and to form line trenches in the mold layer (864).

Figure 19:
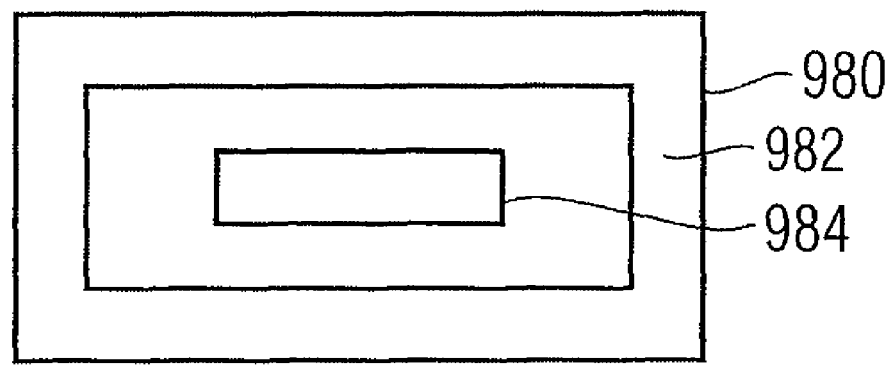
FIG. 19 schematically shows an exemplary embodiment of an electronic system.

FIG. 19 shows a schematic illustration of an electronic system 980. The electronic system 980 comprises a memory or logic device 982 which includes a contact arrangement 984 and/or an interconnection arrangement as described above.

The electronic system 900 may be a audio system, a video system, a graphic card of a computer system, a computer system, as for example a server, a communication system, for example a cell phone, an imaging system, for example a digital camera, a data storage system, for example a data storage module for computer systems or a portable data storage device.

Figure 20:
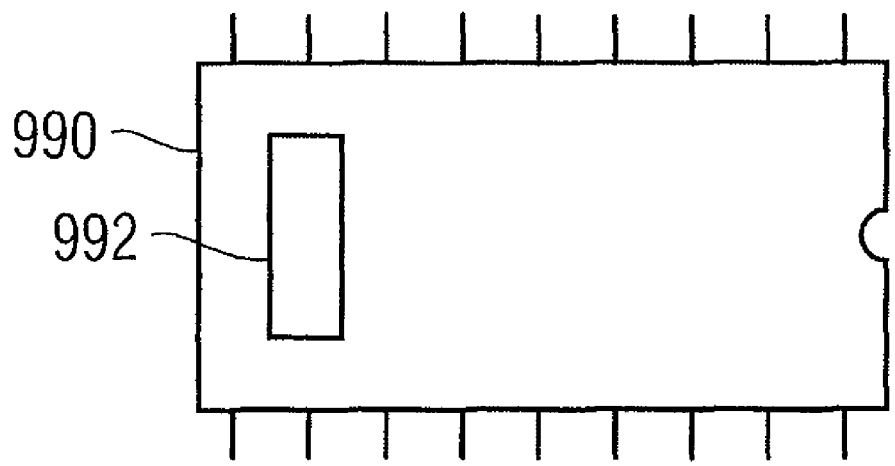
FIG. 20 schematically shows an exemplary embodiment of an integrated circuit.

FIG. 20 is a simplified illustration of an integrated circuit 990, which comprises a contact arrangement 992 and/or an interconnection arrangement as described above. The integrated circuit may be a nonvolatile memory device, for example a floating gate or trapping layer based NAND type flash memory or a DRAM, a graphics DRAM, a consumer DRAM, a cellular DRAM or a PCRAM.

While the invention has been described herein in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An integrated circuit, comprising:
   a substrate including first regions and a second region, wherein the first regions are arranged along a row extending along a row direction;
   a buried mask comprising a first trim opening arranged above the first regions and a second trim opening arranged above the second region;
   a top mask comprising first template openings, each template opening being arranged above a respective first region, and a second template opening arranged above the second region;
   first contacts extending between an upper edge of the top mask and the first regions, wherein each first contact passes through a corresponding first template opening and the first trim opening and is in contact with the buried mask on two opposing sides of the buried mask and is further in contact with the top mask on two opposing sides of the top mask; and
   a second contact extending between an upper edge of the top mask and the second region, wherein the second contact passes through the second template opening and the second trim opening and is in contact with the buried mask on two opposing sides of the buried mask and is further in contact with the top mask on two opposing sides of the top mask.

2. The integrated circuit of claim 1, further comprising:
   an interlayer disposed between the substrate and the buried mask.

3. The integrated circuit of claim 1, further comprising:
   an insulating fill material that is disposed between and separates neighboring first contacts in the first trim opening.

4. The integrated circuit of claim 1, wherein the first regions are evenly spaced at a pitch deviating from 2×F by no more than 50 percent, and F is equivalent to a minimum lithographic feature size.

5. The integrated circuit of claim 1, wherein the first trim opening has a trim width perpendicular to the row direction, and the trim width deviates from a minimum lithographic feature size F by no more than 50 percent.

6. The integrated circuit of claim 1, wherein the first template openings have a template width along the row direction, and the template width deviates from a minimum lithographic feature size F by no more than 50 percent.

7. The integrated circuit of claim 1, wherein the second contact comprises a bottom section that is in contact with the second region and extends along the row direction between the buried mask and the substrate.

8. An electronic system comprising the integrated circuit of claim 1.

9. The electronic system of claim 8, wherein the electronic system comprises one of an audio system, a video system, a computer system, a game console, a communication system, a cell phone, a data storage system, a data storage module, a graphic card comprising an interface to a computer system, a portable storage device comprising an interface to a computer system, an audio system, a video system, a game console and a data storage system.

* * * * *